United States Patent [19]
Tottori

[11] Patent Number: 5,930,674
[45] Date of Patent: *Jul. 27, 1999

[54] SEMICONDUCTOR DEVICE WITH IMPROVED PLANARIZATION PROPERTIES

[75] Inventor: Isao Tottori, Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/518,019

[22] Filed: Aug. 22, 1995

Related U.S. Application Data

[62] Division of application No. 08/019,252, Feb. 18, 1993, Pat. No. 5,479,054.

[30] Foreign Application Priority Data

Mar. 17, 1992 [JP] Japan ............... 4-060696

[51] Int. Cl.⁶ ............................ H01L 21/473
[52] U.S. Cl. .................... 438/646; 438/783; 438/766
[58] Field of Search ............... 437/195, 240, 437/982, 228 PL, 228, 231, 247; 427/255.1; 438/646, 698, 760, 766, 783

[56] References Cited

U.S. PATENT DOCUMENTS

| | | |
|---|---|---|
| 4,582,745 | 4/1986 | Schnable . |
| 4,631,248 | 12/1986 | Pasch . |

(List continued on next page.)

FOREIGN PATENT DOCUMENTS

| | | |
|---|---|---|
| 0 244 848 | 11/1987 | European Pat. Off. . |
| 0 380 327 | 8/1990 | European Pat. Off. . |
| 0465195A2 | 1/1992 | European Pat. Off. . |
| 0469214 | 2/1992 | European Pat. Off. . |
| 58-0034945 | of 0000 | Japan . |
| 57-50449 | 3/1982 | Japan . |
| 0034945 | 3/1983 | Japan . |
| 58-34945 | 3/1983 | Japan . |
| 58-48938 | 3/1983 | Japan . |
| 63-313838 | 12/1988 | Japan . |
| 2184600 | 6/1987 | United Kingdom . |
| 88/01974 | of 0000 | WIPO . |
| 88/04131 | of 0000 | WIPO . |
| 8810008 | 12/1988 | WIPO . |
| 8905038 | 6/1989 | WIPO . |

OTHER PUBLICATIONS

"Modified Phosphosilicate Glasses for VLSI Applications", by K. Nassau et al., Solid–State Science and Technology, Feb. 1985, vol. 132, No. 2, pp. 409–415.

"A Novel Borophosphosilicate Glass Process", by C.Y. Fu, IEDM 85, pp. 602–605.

(List continued on next page.)

*Primary Examiner*—Caridad Everhart
*Attorney, Agent, or Firm*—McDermott, Will & Emery

[57] ABSTRACT

A polycrystalline silicon film is formed on the surface of a semiconductor substrate. An oxide film having a first impurity concentration is formed to cover the polycrystalline silicon film. A polycrystalline silicon film and a refractory metal silicide are formed on the surface of the oxide film having the first impurity concentration. An oxide film having a second impurity concentration higher than the first impurity concentration is formed to cover the polycrystalline silicon film and the refractory metal silicide. The third conductive layer is formed on the surface of the oxide film having the second impurity concentration.

8 Claims, 31 Drawing Sheets

U.S. PATENT DOCUMENTS

| | | | |
|---|---|---|---|
| 4,920,403 | 4/1990 | Chow et al. | |
| 5,004,704 | 4/1991 | Maeda et al. | 437/195 |
| 5,084,416 | 1/1992 | Ozaki et al. | 437/190 |
| 5,160,998 | 11/1992 | Itoh et al. | |
| 5,268,333 | 12/1993 | Lee et al. | 437/235 |
| 5,455,205 | 10/1995 | Umimoto et al. | 437/240 |
| 5,474,955 | 12/1995 | Thakur | 437/173 |
| 5,479,054 | 12/1995 | Tottori | 257/752 |
| 5,496,776 | 3/1996 | Chien et al. | 437/231 |
| 5,598,028 | 1/1997 | Losavio et al. | |
| 5,656,556 | 8/1997 | Yang | 438/646 |

OTHER PUBLICATIONS

"Rapid Flow of Doped Glasses for VLSIC Fabrication", by Jacques S. Mercier, Solid–State Technology, Jul. 1987, pp. 85–91.

"0.3 $\mu$m Process Technique", by Takeo Yoshimi, Trikeps Co., Ltd.

"Application of Chemical Mechanical Polishing to the Fabrication of VLSI Circuit 1991, Interconnections", by William J. Patrick et al., J. Electrochem. Soc., vol. 138, No. 6, Jun. 1991, pp. 1778–1784.

"Modified Phosphosilicate Glasses for VLSI Applications" by K. Nassau et al., Solid–State Science and Technology, Feb. 1985, vol. 132, No. 2, pp. 409–415.

"Application of Chemical Mechanical Polishing to the Fabrication of VLSI Circuit Interconnections", by William J. Pactrick et al., J. Electrochem. Soc., vol. 138, No. 6, Jun. 1991, pp. 1778–1784.

SEMICONDUCTOR DEVICE WITH IMPROVED PLANARIZATION PROPERTIES

This application is a division of application Ser. No. 08/019,252 filed Feb. 18, 1993 now U.S. Pat. No. 5,479,054.

BACKGROUND OF THE INVENTION

1. Field of the Invention

The present invention relates to a semiconductor device and a method of manufacturing thereof, and more particularly, to a semiconductor device including an insulating layer having a highly planarized surface and a method of manufacturing thereof.

2. Description of the Background Art

A structure of a conventional semiconductor device will first be described.

FIG. 15 is a sectional view of a conventional semiconductor device schematically showing a structure thereof. Referring to FIG. 15, an isolation oxide film 111 of approximately 300–800 nm in thickness is formed on the surface of a semiconductor substrate 110 of silicon. An element such as a MOSFET is provided in the region isolated by the isolation oxide film 111. This MOSFET is formed of impurity diffusion layers 114a and 114b serving as the source and drain, a gate oxide film 112, and a polycrystalline silicon film 101 serving as a gate.

The impurity diffusion layers 114a and 114b implementing the source and drain are formed at the surface of the semiconductor substrate 110, and include a portion of low concentration 114a and a portion of high concentration 114b. A gate oxide film 112 is formed on the surface of the semiconductor substrate 110 so as to span over the impurity diffusion layers 114a and 114b. A polycrystalline silicon film 101 implementing a gate is formed on the surface of the gate oxide film 112. A silicon oxide film 113 is formed on the surface of the polycrystalline silicon film 101. A sidewall 115a is formed at the sidewall of the polycrystalline silicon film 101 and the silicon oxide film 113.

A thin silicon oxide film or a nitride film 102 is formed all over the surface of the semiconductor substrate 110 having a MOSFET formed therein. A connection hole 118 is formed in the thin silicon oxide film/nitride film 102. A portion of the surface of the impurity diffusion layer 114b or the polycrystalline silicon film 101 is exposed in the connection hole 118. A polycrystalline silicon film 104a is formed on the surface of the thin silicon oxide film/nitride film 102 so as to be in contact with the exposing portion of the impurity diffusion layer 114b and the polycrystalline silicon film 101. A refractory metal thin film 104b is formed on the surface of the polycrystalline silicon film 104a. An interconnection layer is formed of the polycrystalline silicon film 104a and the refractory metal thin film 104b. On the entire surface of the thin silicon oxide film/nitride film 102 on which this interconnection layer is formed, an interlayer insulating layer 103 including impurities is formed to cover the interconnection layer. The interlayer insulating layer 103 is subjected to planarization. A connection hole 119 is formed in the interlayer insulating layer 103. A portion of the surface of the impurity diffusion region 114b not connected to the polycrystalline silicon film 104a is exposed in the connection hole 119. An interconnection layer 106 of an alloy of aluminum and copper is formed on the surface of the insulating layer 103 so as to form contact with the exposed portion of the impurity diffusion layer 114b.

A conventional semiconductor device has a structure as described in the foregoing.

Next a method of manufacturing a conventional semiconductor device will be described hereinafter.

FIGS. 16–28 are sectional views of a conventional semiconductor device schematically showing the manufacturing steps thereof. Referring to FIG. 16, an isolation oxide film 111 of approximately 300–800 nm in film thickness is formed by local oxidation on the surface of a semiconductor substrate 110 of silicon.

Referring to FIG. 17, a gate oxide film 112 of 5–30 nm in film thickness is formed by thermal oxidation on an exposing region of the semiconductor substrate 110 not covered with the isolation oxide film 111. Then, a polycrystalline silicon film 101 including phosphorus and arsenic an a silicon oxide film 113 are formed on the surface of the semiconductor substrate 110 by chemical vapor deposition. The gate oxide film 112, the polycrystalline silicon film 101, and the silicon oxide film 113 re patterned by photolithography and RIE.

Referring to FIG. 18, impurity ions are implanted to the semiconductor substrate 110 using the polycrystalline silicon film 101, the silicon oxide film 113, and the isolation oxide film 111 as a mask. By this ion implantation, an impurity diffusion layer 114a is formed on the exposed surface of the semiconductor substrate 110.

Referring to FIG. 19, a silicon oxide film 115 is formed to a thickness of 50–300 nm on the surface of the semiconductor substrate 110 by chemical vapor deposition.

Referring to FIG. 20, the silicon oxide film 115 is etched by RIE to form a sidewall 115a at the sidewall of the polycrystalline silicon film 101 and the silicon oxide film 113. Impurity ions are implanted into the semiconductor substrate 110 using the sidewall 115a, the silicon oxide film 113, and the isolation oxide film 111 as a mask to form an impurity diffusion layer 114b. A two layered structure of a portion of high impurity concentration and a portion of low impurity concentration is formed by these impurity diffusion layers 114b and 114a. By the formation of the impurity diffusion layers, a MOS transistor is implemented of impurity diffusion layers 114a, 114b, a gate oxide film 112, and a polycrystalline silicon film 101.

Referring to FIG. 21, a thin silicon oxide film or a nitride film 102 is deposited so as to cover an element such as a MOS transistor formed on the surface of the semiconductor substrate 110.

Referring to FIG. 22, a connection hole 118 is formed in the thin silicon oxide film/nitride film 102 by photolithography and RIE. A portion of the surface of the impurity diffusion layer 114b or the polycrystalline silicon film 101 is exposed in the connection hole 118. In the exposure process of the polycrystalline silicon film 101, the silicon oxide film 113 is also etched.

Referring to FIG. 23, a polycrystalline silicon film 104a and a refractory metal thin film 104b are formed all over the surface of the thin silicon oxide film/nitride film 102 by chemical vapor deposition. The polycrystalline silicon film 104a is electrically connected to the impurity diffusion layer 114b or the polycrystalline silicon film 101 via the connection hole 118.

Referring to FIG. 24, the polycrystalline silicon film 104a and the refractory metal thin film 104b are patterned by photolithography and RIE. By this patterning process, an interconnection layer constituted by the polycrystalline silicon film 104a and the refractory metal thin film 104b is formed.

Referring to FIG. 25, an oxide film 103a including impurities is deposited on the surface of the semiconductor substrate 110 so as to cover the interconnection layer formed of the polycrystalline silicon film 104a and the refractory metal thin film 104b.

Referring to FIG. 26, the oxide film 103a including impurities is subjected to thermal treatment at a temperature of 800° C.–1000° C. for planarization. Following the thermal treatment, the oxide film 103a including impurities is reduced in film thickness by an overall itching. A thin oxide film or a nitride film is deposited on the surface of the oxide film 103a including impurities. Thus, an interlayer insulating layer 103 is obtained.

Referring to FIG. 27, a connection hole 119 is formed in the interlayer insulating layer 103 by photolithography and RIE The connection hole 119 is formed to reach the impurity diffusion layer 114b that is not electrically connected to the polycrystalline silicon film 104a.

Referring to FIG. 28, an aluminum-copper alloy film is deposited on the surface of the interlayer insulating layer 103 by sputtering. By patterning this aluminum-copper alloy film by photolithography and RIE, an interconnection layer 106 is formed. This interconnection layer 106 is electrically connected to the impurity diffusion layer 114b via the connection hole 119.

A conventional semiconductor device is formed as described in the foregoing.

Because conventional semiconductor device was formed as described above, the surface of the interlayer insulating layer 103 was insufficient in planarization. An interlayer insulating layer 103 having a surface lacking planarization will generate problems as set forth in the following.

FIG. 29 is a sectional diagram schematically showing a state of exposing a resist. Referring to FIG. 29, a resist 202 is applied on the surface of an underlying layer 201. The resist 202 is patterned to a desired configuration using a mask 203. In this patterning process, the light of exposure is introduced in a direction indicated by the arrow A only into a region 202a that should be exposed defined by the mask 203. However, the presence of a stepped portion in the underlying layer 201 will cause the light of exposure to be reflected in the direction indicated by arrow B. This reflected light in the direction of arrow B will expose a region 202b which should not be actually exposed. This means that it is difficult to expose the resist 202 to a desired configuration if there is a stepped portion in the underlying layer 201. Thus, it will be difficult to pattern the resist 202 properly to a desired configuration.

FIG. 30 is a sectional diagram schematically showing the optimum focusing position in exposing a resist. Referring to FIG. 30, a resist 202 is applied on the surface of an underlying layer 201. A stepped portion in the underlying layer 201 will result in a resist 202 differing in thickness according to the portion thereof. A difference in thickness will mean that the optimum focusing position of the light of exposure for exposing the resist 202 will also differ. More specifically, the optimum focusing position of the light of exposure at the respective positions of C and D is c and d, respectively, as shown in FIG. 30. If exposure is carried out conforming to the focus at position C, the pattern at position D will be degraded in configuration. Conversely, if exposure is carried out conforming to the focus at position D, the pattern at position C is degraded in configuration as shown in FIG. 32. It is therefore difficult to properly pattern the resist 202 in a desired configuration.

As described above, the resist 202 cannot be patterned to a desired configuration if there is a stepped portion in the underlying layer 201. If etching is carried using such a resist of unsatisfactory configuration as a mask, the dimension of the finished product will differ from the design dimension. Such an offset in the finished dimension will be a fatal disadvantage in the attempt to reduce the size of semiconductor devices, with difficulty in the formation of patterns of connection holes and metal interconnection layers.

There is also a problem which will be described hereinafter in the case of filling a connection hole with a plug if the surface of the interlayer insulating layer of FIG. 28 is not sufficient in planarization.

FIGS. 33 and 34 are a sectional view and a plan view, respectively, of a semiconductor device schematically showing problem encountered by filling the connection hole with a plug. Referring to FIGS. 33 and 34, a plug 202 is formed in a connection hole 201. An upper conductive layer 204 is electrically connected to a lower conductive layer 203 by means of the plug 202. This plug 202 is obtained by etching a conductive layer deposited all over the surface of the insulating layer 205. An insufficient planarization of the surface of the insulating layer 205 will result in a residue 202a at the stepped portion on the surface of the insulating layer 205 at the time of plug formation. There is a possibility of other interconnection layers 206a and 206b being short circuited by this residue 202a, as shown in FIG. 34. There was a problem of degradation in electrical reliability such as shorting of the interconnection layers due to generation of a residue in the stepped portion if planarization was not sufficient in the surface of the interlayer insulating layer 103 shown in FIG. 28.

SUMMARY OF THE INVENTION

An object of the present invention is to facilitate formation of patterns of connection holes and metal interconnection layers in accordance with miniaturization by reducing the surface stepped portion of an insulating layer in a semiconductor device.

Another object of the present invention is to improve electrical reliability of a semiconductor device by reducing the surface stepped portion of an insulating layer in a semiconductor device.

In order to achieve the above objects, a semiconductor device according to the present invention includes a first conductive layer, a first insulating layer, a second conductive layer, a second insulating layer, and a third conductive layer. The first conductive layer is formed on the surface of a semiconductor substrate. The first insulation film has a first glass transition temperature and a planarized surface, and is formed to cover the first insulating layer. The second conductive layer is formed on the surface of the planarized first insulating layer. The second insulating layer has a second glass transition temperature that is lower than the first glass transition temperature and a planarized surface, and is formed to cover the second conductive layer. The third conductive layer is formed on the surface of the planarized second insulating layer.

The semiconductor device includes a first insulating layer having a first glass transition temperature and a second insulating layer having a second glass transition temperature. It is therefore possible to apply a planarization process individually for the first and second insulating layers, whereby the surface stepped portion of the second insulating layer can be reduced effectively. That is to say, the step on the surface of the second insulating layer is relatively reduced because the second insulation film is formed after the planarization of the first insulation film. The stepped portion on the surface of the second insulation film can further be reduced because the second insulation film is also subjected to planarization. Thus, the second insulation film will result in a highly planarized surface to facilitate patterning of the resist above the insulating layer to a desired configuration. Furthermore, a residue will not be left at the stepped portion at the time of plug formation because the second insulating layer has a highly planarized surface. Therefore, shorting caused by a residue will not occur between other conductive layers, so that the electrical reliability is improved.

Because the first insulating layer has a first glass transition temperature and the second insulating layer has a second glass transition temperature that is lower than the first glass transition temperature, there will be no flow of the first insulating layer when the second insulating layer located above the first insulating layer is subjected to a planarization process. Therefore, deformation of the second insulating layer formed on the surface of the first insulating layer due to a flow of the first insulating layer will not occur. In other words, the position of the second conductive layer will not be offset. Thus, the electrical reliability is improved because the second conductive layer will not be electrically connected to another conductive layer by an offset in position.

In order to achieve the above objects, the semiconductor device includes a first conductive layer, a first insulating layer, a second conductive layer, a second insulating layer, and a third conductive layer. The first conductive layer is formed on the surface of a semiconductor substrate. The first insulating layer is formed of a first material, has its surface planarized, and covers the first conductive layer. The second conductive layer is formed on the surface of the planarized first insulating layer. The second insulating layer is formed of a second material different from the first material, has its surface planarized, and covers the second conductive layer. The third conductive layer is formed on the surface of the planarized second insulating layer.

Because the semiconductor device includes a first insulating layer formed of the first material and a second insulating layer formed of a second material, there is hardly no flow in the first insulating layer even if a planarization process is applied to the second insulating layer above the first insulating layer. The second conductive layer formed on the surface of the first insulating layer will not be moved by the flow of the first insulating layer. That is to say, position offset does not occur in the second conductive layer, so that electrical connection with another conductive layer caused by an offset in position is not generated. Therefore, the electrical reliability is improved.

In order to achieve the above objects, as shown in FIG. 9 a semiconductor device of the present invention includes a first conductive layer, a first insulating layer, a second insulating layer, a third insulating layer, a second conductive layer, a fourth insulating layer, a fifth insulating layer, a sixth insulating layer, and a third conductive layer. The first conductive layer is formed on the surface of a semiconductor substrate. The first insulating layer is formed on the semiconductor substrate to cover the first conductive layer. The second insulating layer has a first glass transition temperature, and is formed on the first insulating layer. The third insulating layer is formed on the second insulating layer. The second conductive layer is formed on the surface of the third insulating layer. The fourth insulating layer is formed on the third insulating layer to cover the surface of the second conductive layer. The fifth insulating layer is formed on the fourth insulating layer, and has second glass transition temperature lower than the first glass transition temperature. The sixth insulating layer is formed on the fifth insulating layer. The third conductive layer is formed on the surface of the fifth insulating layer.

This semiconductor device has the first, the third, the fourth, and the sixth insulating layers. The first insulating layer prevents impurities of an upper layer to diffuse into the first conductive layer and also prevents oxidation of the first conductive layer in the planarization process of the surface of the second insulating layer, for example. The third insulating layer fixes the second conductive layer to prevent deviation of the position of the second conductive layer, and also prevents impurities from a lower layer to diffuse into the second conductive layer in the planarization process of the surface of the fifth insulating layer, for example. The fourth conductive layer prevents deviation of the position of the second conductive layer, prevents diffusion of impurities from an upper layer into the second conductive layer, and prevents oxidation of the second conductive layer in the planarization process of the surface of the fifth insulating layer, for example. When a conductive layer is formed on the surface of the sixth insulating layer, for example, the sixth insulating layer prevents diffusion of impurities from a lower layer to this conductive layer and prevents corrosion therein.

In order to achieve the above objects, the semiconductor device includes a first patterned layer, a first insulating layer, a second patterned layer, and a second insulating layer. The first patterned layer of conductive material is formed on the surface of a semiconductor substrate. The first insulating layer is formed to over the first patterned layer, the first insulating layer being of a material that flows at a first prescribed temperature and having an upper surface planarized by heating at the first prescribed temperature. The second patterned layer of conductive material is formed on the first insulating layer. The second insulating layer is formed to cover the second patterned layer, the second insulating layer being of a material that flows at a second prescribed temperature less than the first prescribed temperature, and having an upper surface planarized by heating at the second prescribed temperature.

Because this semiconductor device has the first insulating layer formed of a material that flows at the first prescribed temperature, and the second insulating layer formed of a material that flows at a second temperature lower than the first temperature, the first and second insulating layers can individually be subjected to a planarization process. This individual planarization process allows the stepped portion in the surface of the second insulating layer to be reduced significantly. More specifically, a stepped portion generated on the surface of the second insulating layer is relatively reduced because the second insulating layer is formed after planarization of the first insulating layer. The second insulating layer is subjected to planarization, whereby the stepped portion on the surface of the second insulating layer is further reduced. A highly planarized surface of the second insulating layer facilitates patterning of the resist on the upper layer of this insulating layer to a desired configuration. Also, a residue is less likely to be generated at the surface stepped portion during the formation of a flag owing to a highly planarized surface of the second insulating layer. Therefore, the problem of a residue resulting in short circuit between other conductive layers is avoided to improve electrical reliability.

Because the first insulating layer is planarized by being heated at a first prescribed temperature and the second insulating layer is planarized by being heated at a second prescribed temperature lower than the first prescribed temperature, flow will not be seen in the first insulating layer even when the second insulating layer located on the first insulating layer is subjected to a planarization process. Therefore, the second patterned layer formed on the surface of the first insulating layer will not move in accordance with the flow of the first insulating layer. More specifically, deviation of position of the second patterned layer will not occur. Therefore, the problem of the second patterned layer being electrically connected to another conductive layer by deviation of position will not occur to improve electrical reliability thereof.

In order to achieve the above objects, a method of manufacturing a semiconductor device according to the present invention includes the steps of forming a first conductive layer on the main surface of a semiconductor substrate, forming a first insulating layer to cover the second conductive layer, wherein the first insulating layer has its surface planarized by a first condition, forming a second conductive layer on the surface of the planarized first insulating layer, forming a second insulating layer to cover the second conductive layer, wherein the second insulation has its surface planarized by a second condition differing from the first condition, and forming a third conductive layer on the surface of the planarized second insulating layer.

According to this method of manufacturing a semiconductor device, the first and second insulating layers are made to flow individually, so that the stepped portion on the surface of the second insulating layer is reduced significantly. That is to say, the stepped portion generated at the surface of the second insulating layer is relatively reduced smaller because the second insulating layer is formed after the planarization of the first insulating layer. The stepped portion on the surface of the second insulating layer can further be reduced because a planarization process is also applied to the second insulating layer. Thus, the second insulating layer has a highly planarized surface to facilitate patterning of the resist on the second insulating layer to a desired configuration. Furthermore, there is less possibility of a residue left at the stepped portion on the surface at the time of plug formation because the surface of the second insulating layer has a highly planarized surface. Therefore, the electrical reliability is improved without shorting occurring between conductive layers by the residue.

In order to achieve the above objects, a method of manufacturing a semiconductor device according to the present invention includes the steps of forming a first patterned layer of a conductive material on the surface of a semiconductor substrate, forming a first insulating layer of a material that flows at a first predetermined temperature to cover the first patterned layer, wherein the first insulating layer is heated at the first predetermined temperature to have a planarized upper surface, forming a second patterned layer of a conductive material on the surface of the first insulating layer, forming a second insulating layer of a material that flows at a second predetermined temperature lower than the first predetermined temperature to cover the second patterned layer, wherein the second insulating layer is heated at the second predetermined temperature to have a planarized upper face.

According to this manufacturing method of a semiconductor device, the first insulating layer and the second insulating layer are made to flow individually, so that the stepped portion on the surface of the second insulating layer is reduced significantly. That is to say, the stepped portion generated at the surface of the second insulating layer is smaller because the second insulating layer is formed after the planarization of the first insulating layer. The stepped portion on the surface of the second insulating layer can further be reduced because a planarization process is also applied to the second insulating layer. Thus, the second insulating layer has a highly planarized surface to facilitate patterning of the resist on the second insulating layer to a desired configuration. Furthermore, there is less possibility of a residue left at the stepped portion on the surface at the time of plug formation because the surface of the second insulating layer has a highly planarized surface. Therefore, the electrical reliability is improve without shorting occurring between conductive layers by the residue.

Because the first insulating layer is made to flow by a first predetermined temperature, and the second insulation film is made to flow by a second predetermined temperature that is lower than the first predetermined temperature, the first insulating layer will not attain a flowing state at the time of the flow of the second insulating layer. Therefore, deviation of the position of the second conductive layer formed on the surface of the first insulating layer due to a flow of the first insulating layer will not occur. That is to say, there is no offset in the position of the second conductive layer. Therefore, electrical reliability is improved because the second patterned layer is prevented from being electrically connected to another conductive layer caused by offset in position.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A semiconductor device according to an embodiment of the present invention will be described hereinafter.

Figure 1:
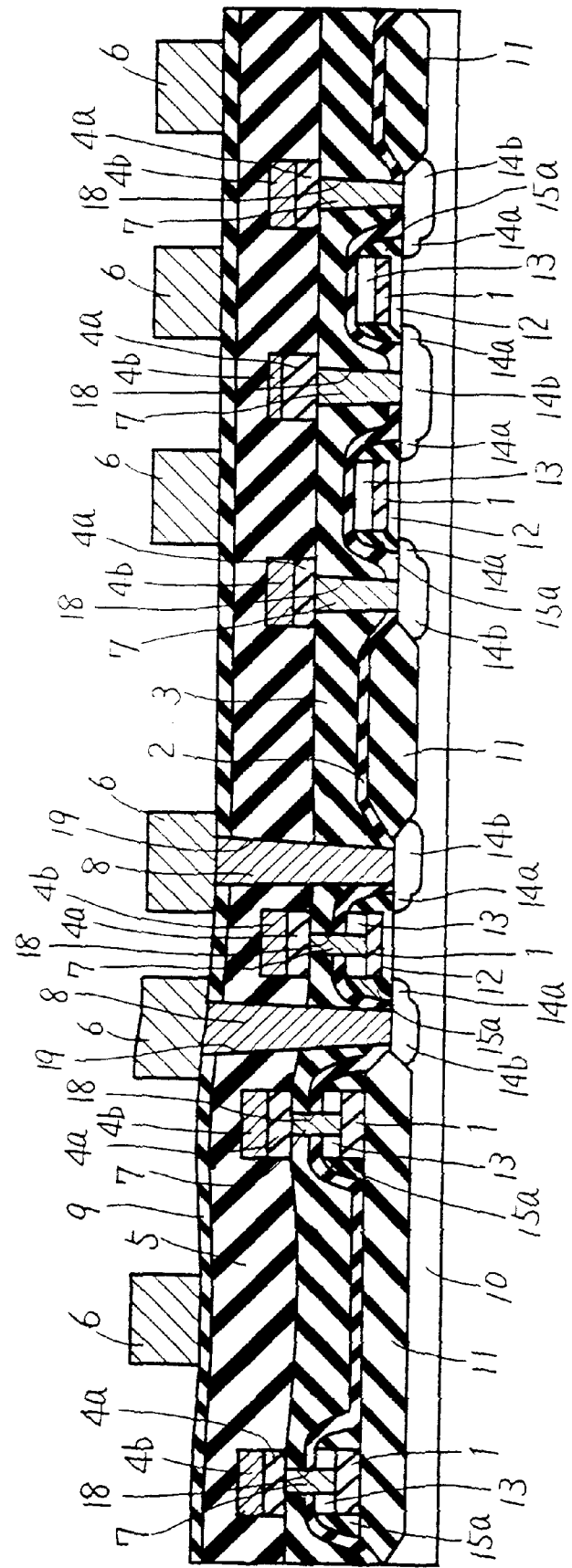
FIG. 1 is a sectional view schematically showing a structure of a semiconductor device according to an embodiment of the present invention.

Referring to FIG. 1, an isolation oxide film 11 of approximately 300–800 nm in thickness is formed on the surface of a semiconductor substrate 10 of silicon. An element such as a MOSFET is formed in each region on the semiconductor substrate 10 isolated by the isolation oxide film 11. The MOSFET is implemented by impurity diffusion layers 14a and 14b forming the source and drain, a gate oxide film 12, and a polycrystalline silicon film 1 forming a gate.

The impurity diffusion layers 14a and 14b serving as the source and drain are formed at the surface of the semiconductor substrate 10. The gate oxide film 12 is formed on the surface of the semiconductor substrate 10 to extend over the source and drain of the impurity diffusion layers 14a and 14b. The polycrystalline silicon film 1 serving as a gate is formed on the surface of the gate oxide film 12. The first conductive layer is formed of a MOSFET including the polycrystalline silicon film 1. The silicon oxide film 13 is formed on the surface of the polycrystalline silicon film 1. A sidewall 15a is formed at the sidewalls of the gate oxide film 12, the polycrystalline silicon film 1, and the silicon oxide film 13.

A thin silicon oxide film or a nitride film 2 is formed on the surface of the semiconductor substrate 10 having the MOSFET formed therein to cover each element. A planarized oxide film 3 having a first concentration of impurity is formed on the surface of the thin silicon oxide film/nitride film 2. This is the first insulation film. The oxide film 3 has a first glass transition temperature depending on the first impurity concentration. A glass transition temperature is defined as the temperature at which the insulating layer begins to flow. A connection hole is formed in the thin silicon oxide film/nitride film 2 and the oxide film 3. A portion of the surface of the impurity diffusion layer 14b or the polycrystalline silicon film 1 is exposed in the connection hole 18. The silicon oxide film 13 is also etched to form a connection hole exposing a portion of the surface of the polycrystalline silicon film 1. A plug 7 formed of polycrystalline silicon film is filled in the connection hole 18. The plug 7 is electrically connected to the impurity diffusion layer 14b or the polycrystalline silicon film 1. A polycrystalline silicon film 4a is formed in contact with the plug 7 on the surface of the oxide film 3 including impurities. A refractory metal silicide 4b is formed on the surface of the polycrystalline silicon film 4a. The second conductive layer is formed of the polycrystalline silicon film 4a and the refractory metal silicide 4b. The second conductive layer is electrically connected to the impurity diffusion layer 14b or the polycrystalline silicon film 1 via the plug 7. An oxide film 5 having a second impurity concentration is formed on the surface of the oxide film 3 so as to cover the second conductive layer formed of the polycrystalline silicon film 4a and the refractory metal silicide 4b. The second impurity concentration of the oxide film 5 is higher than the first impurity concentration of the oxide film 3. The oxide film 5 is the second insulating layer. The oxide film 5 has a second glass transition temperature depending on the second impurity concentration. A second thin silicon oxide film or a nitride film 9 is formed all over the surface of the oxide film 5. A connection hole 19 is formed in the first thin silicon oxide film/nitride film 2, the oxide film 3, the oxide film 5, and the second thin silicon oxide film/nitride film 9. A portion of the surface of the impurity diffusion layer 14b not electrically connected to the plug 7 is exposed in the connection hole 19. The connection hole 19 is filled with a plug formed of tungsten. The plug 8 is electrically connected to the impurity diffusion layer 14b. An interconnection layer 6 of aluminum-copper alloy which is the third conductive layer is formed on the surface of the second silicon oxide film/nitride film 9 in contact with the plug 8 The interconnection layer 6 constitutes the third conductive layer.

The semiconductor device according to an embodiment of the present invention has a structure as described above.

A method of manufacturing this semiconductor device according to an embodiment of the present invention will be described hereinafter.

Figure 2:
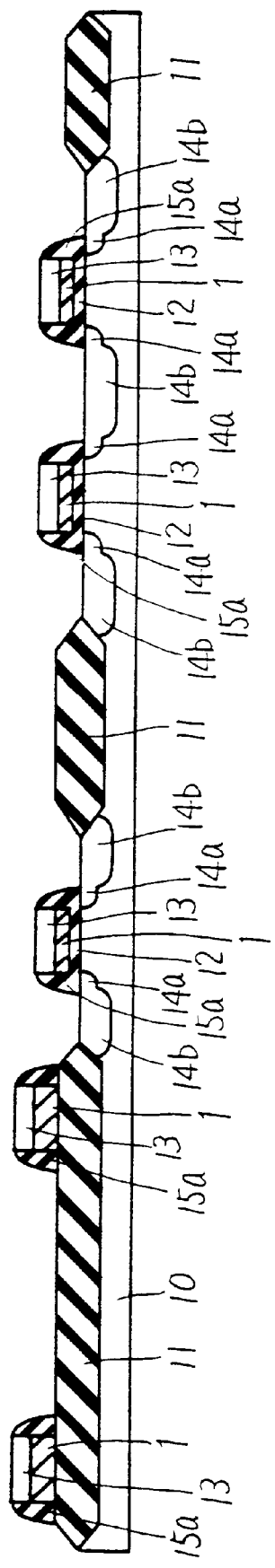
FIGS. 2–6 are sectional views of the semiconductor device of FIG. 1 showing the manufacturing steps thereof.

Referring to FIG. 2, the process up to the formation of a MOS transistor constituted by impurity diffusion layers 14a, 14b, the gate oxide film 12, and the polycrystalline silicon film 1 is similar to that of a conventional one and will not be repeated.

Figure 3:
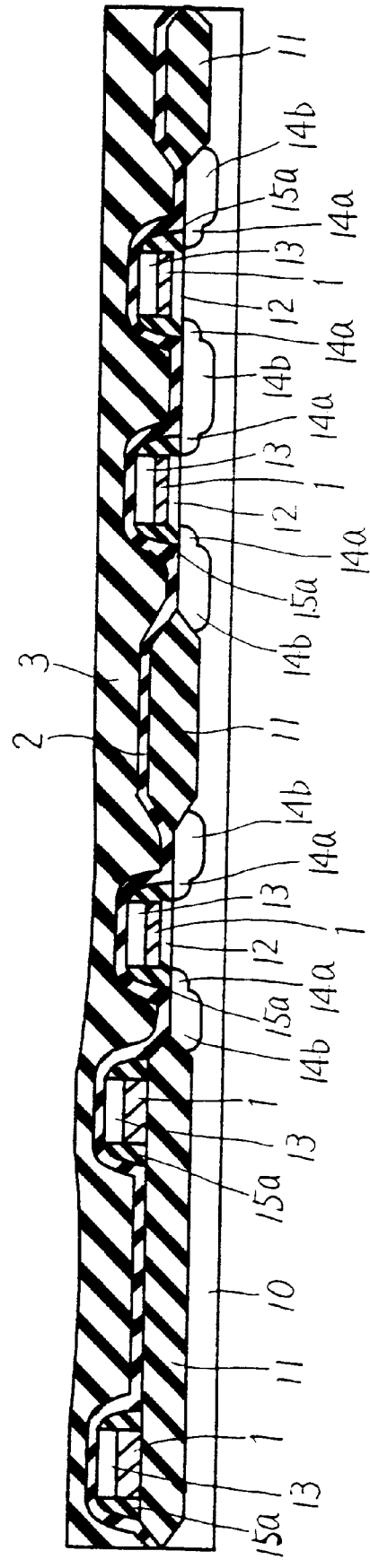

Referring to FIG. 3, a first thin silicon oxide film/nitride film 2 is formed to cover an element such as a MOS transistor by chemical vapor deposition. An oxide film 3 having the first impurity concentration is deposited all over the surface of the first silicon oxide film/nitride film 2. The oxide film 3 has the surface planarized by thermal treatment. Then, the whole surface of the oxide film 3 is etched to be reduced in thickness.

Figure 4:
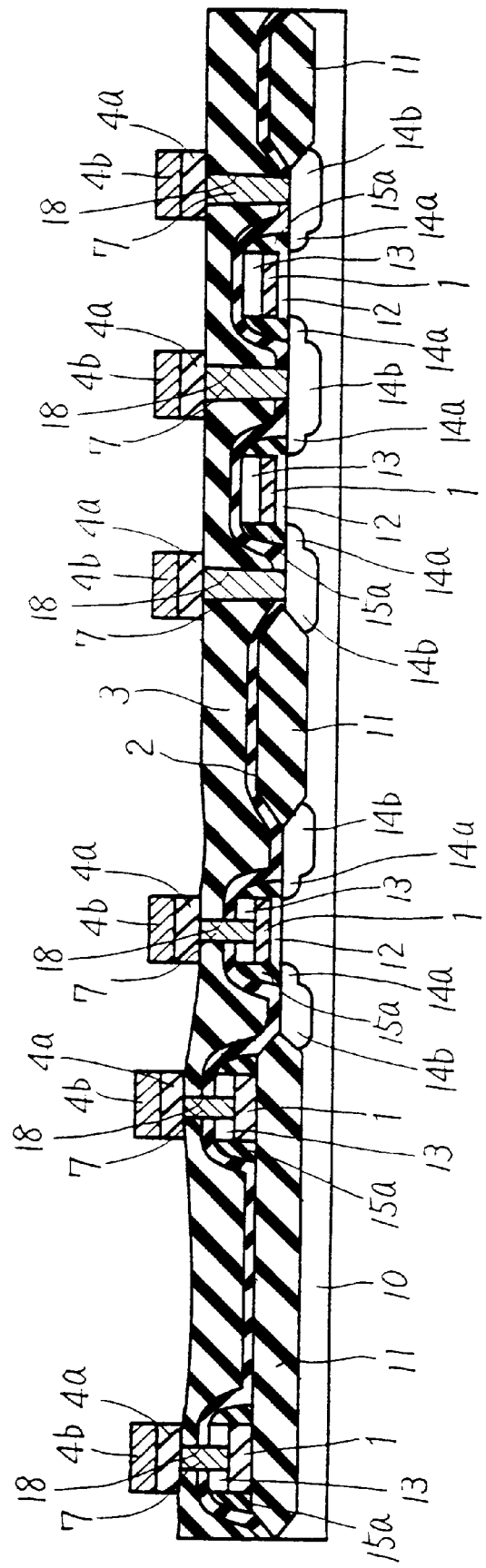

Referring to FIG. 4, a connection hole 18 is formed by photolithography and RIE in the oxide film 3 having a surface of favorable planarization. A polycrystalline silicon film is formed all over the surface of the oxide film 3 by chemical vapor deposition. This polycrystalline silicon film is etched by RIE to form a polycrystalline silicon plug 7 filling the connection hole 18. The polycrystalline silicon plug 7 is electrically connected to the polycrystalline silicon film 1. The polycrystalline silicon film 4a and the refractory metal thin film 4b are deposited on the whole surface of the oxide film 3. The polycrystalline silicon film 4a and the refractory metal thin film 4b are patterned by photolithography and RIE to form a second conductive layer having composite film layer of a polycrystalline silicon film 4a and a refractory metal silicide 4b in contact with the polycrystalline silicon plug 7. The second conductive layer is electrically connected to the impurity diffusion layer 14b or the polycrystalline silicon film 1 via the polycrystalline silicon plug 7.

Figure 5:
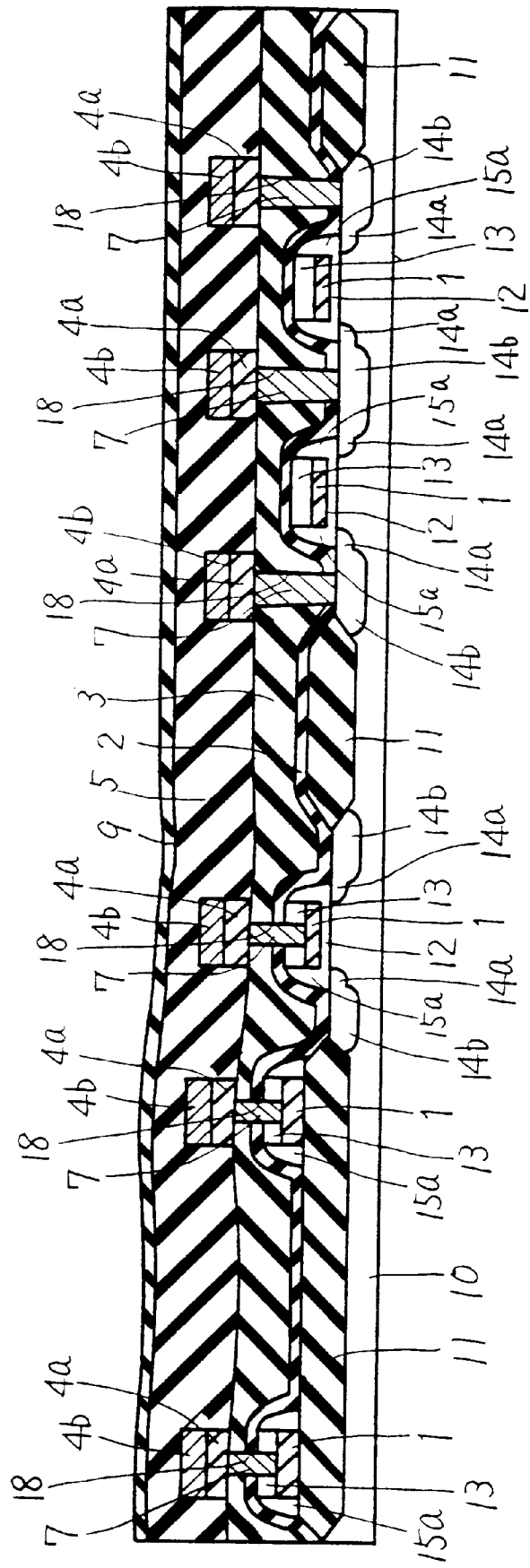

Referring to FIG. 5, an oxide film 5 having a second impurity concentration higher than the first impurity concentration is deposited on the surface of the oxide film 3 having the first impurity concentration so as to cover he second conductive layer. The oxide film 5 is subjected to planarization at a thermal treatment temperature lower than that of the planarization of the oxide film 3. Following the planarization process, the oxide film 5 has all its surface etched to be reduced in thickness. A second thin silicon oxide film/nitride film 9 is deposited all over the surface of the planarized oxide film 5. The temperature of the thermal process for planarizing the oxide film 5 having the second impurity concentration must be set to a low level such that the oxide film 3 having the first impurity concentration is not softened. More specifically, the glass transition temperature of the oxide film 5 must be lower than that of the oxide film 3.

Figure 6:
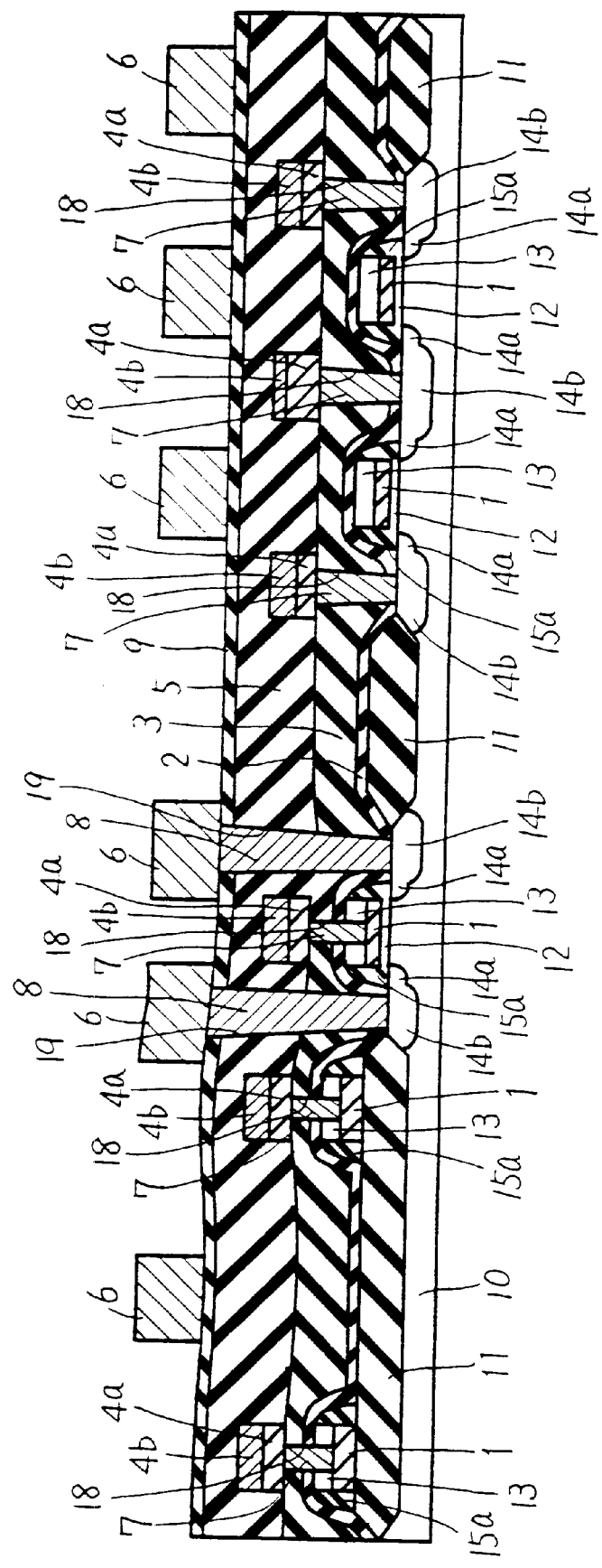

Referring to FIG. 6, a connection hole 19 is formed by photolithography and RIE in the first silicon oxide film/nitride film 2, the oxide film 3, the oxide film 5, the second silicon oxide film/nitride film 9. A portion of the surface of the impurity diffusion layer 14b not electrically connected to the polycrystalline silicon plug 7 is exposed in the connection hole 19. Impurities are implanted into the connection hole 19. A thermal treatment is applied to activate the implanted impurities. This thermal process is carried out at a temperature lower than the softening temperature of the oxide film 5. Then, a tungsten thin film including tungsten fluoride ($WF_6$) is formed by helical vapor deposition on the surface of the second silicon oxide film/nitride film 9. The tungsten thin film is etched by RIE to form a tungsten plug 8 filling the connection hole 19. An aluminum-copper alloy film is deposited by sputtering on the surface of the second silicon oxide film/nitride film 9. The aluminum-copper alloy film is patterned by photolithography and RIE to form a third conductive layer 6 of aluminum-copper alloy on the surface of the second silicon oxide film/nitride film 9 in contact with the tungsten plug 8. The third conductive layer 6 is electrically connected to the impurity diffusion layer 14b via the tungsten plug 8.

The semiconductor device according to an embodiment of the present invention is manufactured as described above.

The functions of the first and second silicon oxide films/nitride films 2 and 9 of FIG. 1 will be described hereinafter.

Referring to FIG. 1, the first thin silicon oxide film/nitride film 2 prevents the impurities of the oxide film 3 from diffusing into the underlying polycrystalline silicon film 1 and the impurity diffusion layers 14a and 14b during the thermal treatment of the planarization process. The thermal treatment for the planarization of the oxide film 3 may be carried out in an oxidizing ambient such as steam ambient using a diffusion furnace. In this case, the first silicon oxide film/nitride film 2 prevents the oxidation of the polycrystalline silicon film 1 and impurity diffusion layers 14a and 14b.

The second thin silicon oxide film/nitride film 9 prevents the impurities of the oxide film 5 from diffusing into the overlying third conductive layer 6. In an ambient including humidity, boron oxide which is the impurity included in the oxide film 5 is precipitated at the surface layer to form acid. The second silicon oxide film/nitride film 9 suppresses corrosion of the interconnection caused by this acid to prevent degradation in the reliability of the interconnection. The second silicon oxide film/nitride film 9 further has an effect to improve the adherence of the resist in patterning the third conductive layer 6.

The method of forming the silicon oxide film, the silicon nitride film, the conductive layer, and the plug is not limited to that described in the above embodiment, and other methods may be used. Although examples of polycrystalline silicon and tungsten are described as the material of the plug in the present embodiment, aluminum or the like may be used. The impurities included in the interlayer insulating layer of the oxide film 3 or the oxide film 5 can be at least an impurity of phosphorus, boron, arsenic, and the like. The impurity is preferably one that reduces the glass transition temperature of the interlayer insulating layer. Because a higher level of planarization can be obtained as the film is thicker, the deposited film thickness of the oxide film 3 and 5 is set to be substantially equivalent to the stepped portion. The method of reducing the thickness of the oxide films 3 and 5 by etching may be carried out according to a method by hydrofluoric acid (HF), by RIE, or by abrasion of a silicon oxide film by chemical mechanical abrasion (Journal of Electrochemical Society, vol. 138, page 1778). Although the above embodiment was described as having three layers of the first, the second, and the third conductive layers, the present invention is applicable to a semiconductor device having conductor layers more than three layers.

The disadvantage of the oxide film 3 and the oxide film 5 of FIG. 1 having the same impurity concentration is describe hereinafter.

Figure 7:
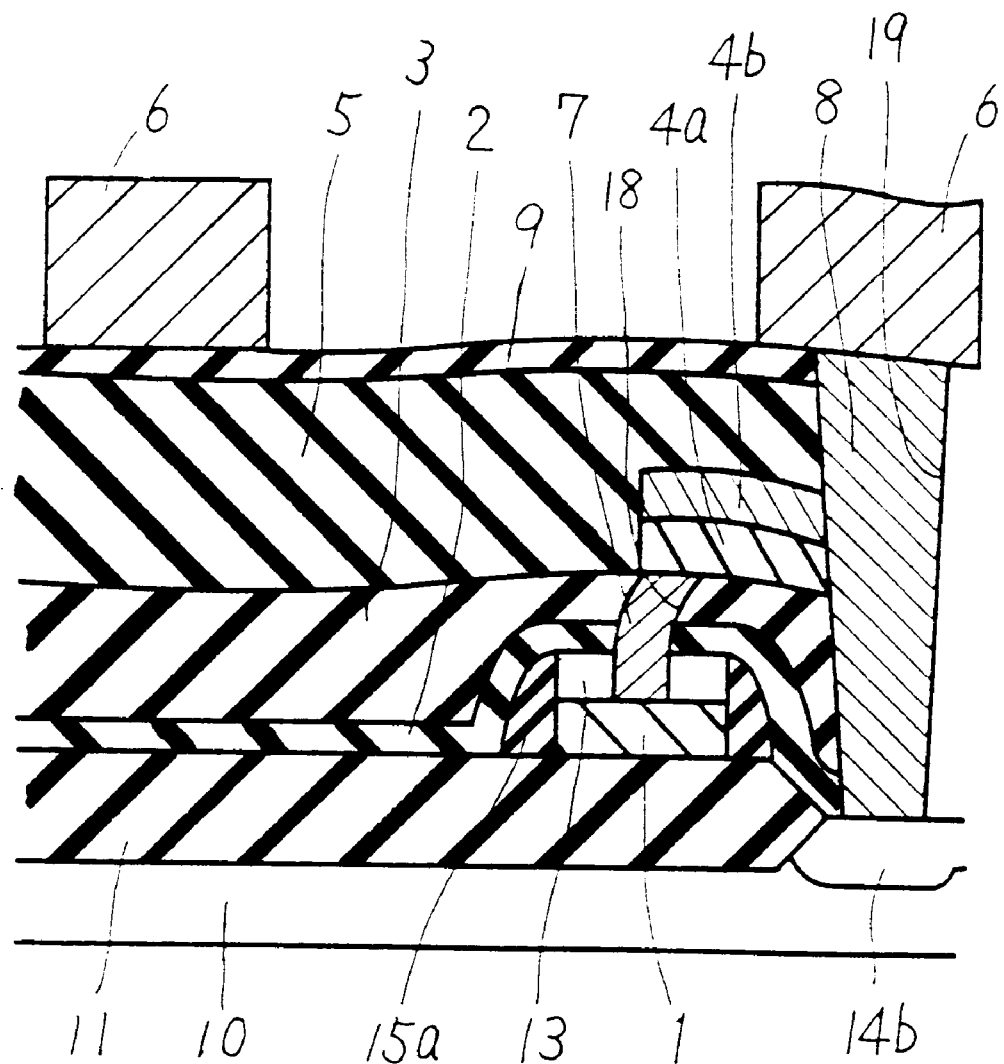
FIG. 7 is an enlarged sectional view of a semiconductor device schematically showing a problem caused by the first impurity concentration and the second impurity concentration being identical.

Referring to FIG. 7, the oxide film 5 having the second impurity concentration is subjected to thermal treatment for the planarization of the stepped portion, whereby the oxide film 5 is softened to attain a flowing state. If the impurity concentration of the oxide film 3 is identical to that of the oxide film 5, the oxide film 3 will also attain a flowing state during the thermal process for the planarization of the oxide film 5. This flow will deform the oxide film 3. The second conductive layers 4a and 4b formed on the surface of the oxide film 3 will be moved according to the deformation of the oxide film 3 to result in position offset. This deviation in the position of the second conductive layers 4a and 4b will incur a possibility of forming contact with the adjacent conductive region 8. If the second conductive layers 4a and 4b are brought into contact with the adjacent conductive region 8, there will be a disadvantage of generation of electrical defect in the semiconductor device.

A structure of a semiconductor device according to another embodiment of the present invention will be described hereinafter.

Figure 8:
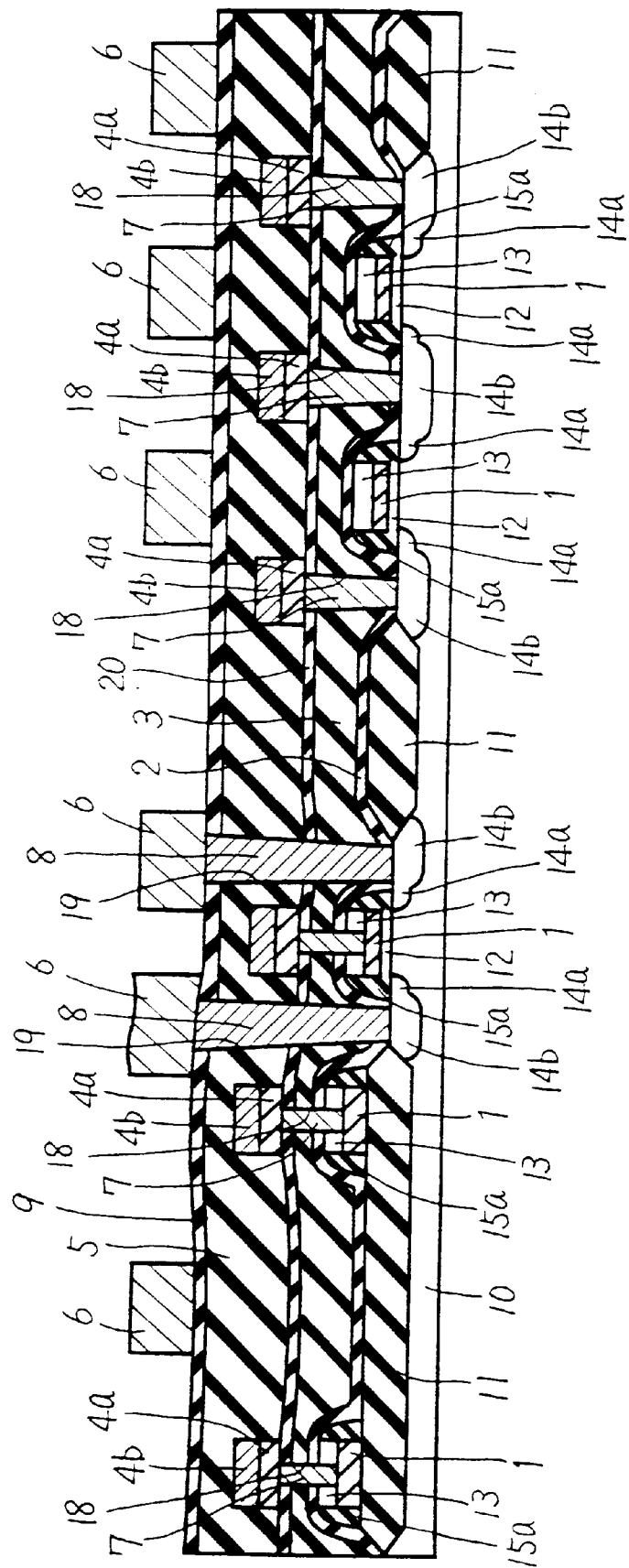
FIG. 8 is a sectional view schematically showing a structure of a semiconductor device according to another embodiment of the present invention.

Referring to FIG. 8, a third thin silicon oxide film or a nitride film 20 is formed all over the surface of the third oxide film 3 having the first impurity concentration. The second conductive layers 4a and 4b are formed on the surface of the third silicon oxide film/nitride film 20 to be electrically connected to the impurity diffusion layer 14b or the polycrystalline silicon film 1. The structure of the other components is identical to that of the semiconductor device according to the first embodiment of the present invention shown in FIG. 1, and their description will not be repeated.

The third thin silicon oxide film/nitride film 20 serves to fix the oxide film 3, and also serves to suppress he offset in position of the second conductive layers 4a and 4b occurring during the thermal treatment for the planarization of the oxide film 5. Furthermore, the third thin silicon oxide film/nitride film 20 prevents the impurities of the oxide film 3 having the first impurity concentration from diffusing into the second conductive layers 4a and 4b, and also the corrosion of the second conductive layers 4a and 4b due to the hygroscopicity of the impurities to improve the adherence of the resist at the time of pattern formation of the second conductive layers 4a and 4b.

A structure of a semiconductor device according to a further embodiment of the present invention will be described hereinafter.

Figure 9:
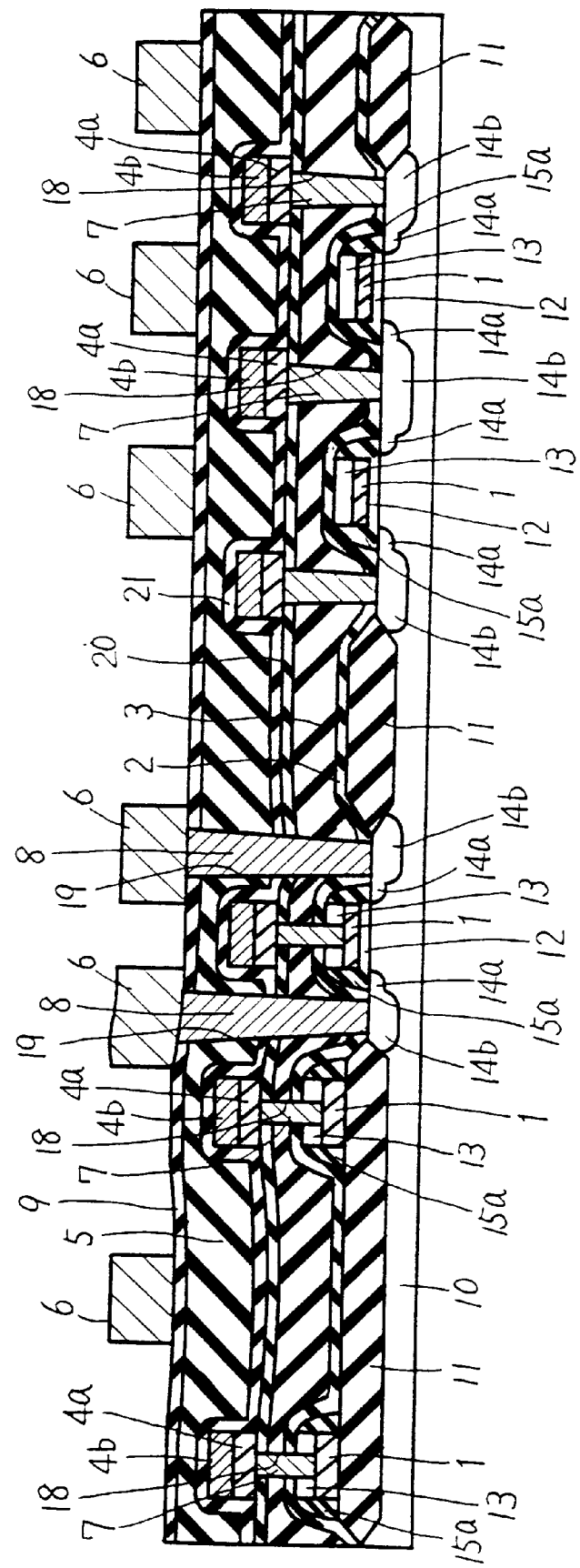
FIG. 9 is a sectional view schematically showing a structure of a semiconductor device according to a further embodiment of the present invention.

Referring to FIG. 9, a third silicon oxide film/nitride film 20 is formed all over the surface of the oxide film 3 having the first impurity concentration. The second conductive layers 4a and 4b on the surface of the third thin silicon oxide film/nitride film 20 are electrically connected to the impurity diffusion layer 14b and the polycrystalline silicon film 1 via the plug 7. A fourth then silicon oxide film or a nitride film 21 is formed on the surface of the third thin silicon oxide film/nitride film 20 so as to cover the second conductive layers 4a and 4b. An oxide film 5 having the second impurity concentration is formed on the surface of the fourth thin silicon oxide film/nitride film 21. The structure of the remaining components is identical to that of the semiconductor device of the first embodiment shown in FIG. 1 and the description thereof will not be repeated.

The fourth silicon oxide film/nitride film 21 serves to fix the second conductive layers 4a and 4b, and also serves to suppress the offset of the position of the second conductive layers 4a and 4b caused by the thermal process or the planarization of the oxide film 5. Furthermore, the fourth silicon oxide film/nitride film 21 prevents the impurities of the oxide film 5 to diffuse into the underlying second conductive layers 4a and 4b, and also prevents oxidation of the second conductive layers 4a and 4b occurring during the thermal process for the planarization of the oxide film 5 carried out under an oxidizing ambient such as steam ambient using a diffusing furnace. Therefore, it is possible to introduce a large amount of impurities into the oxide film 5, so that the thermal process for planarization of the oxide film 5 can be Carrie out at a lower temperature.

Figure 10B:
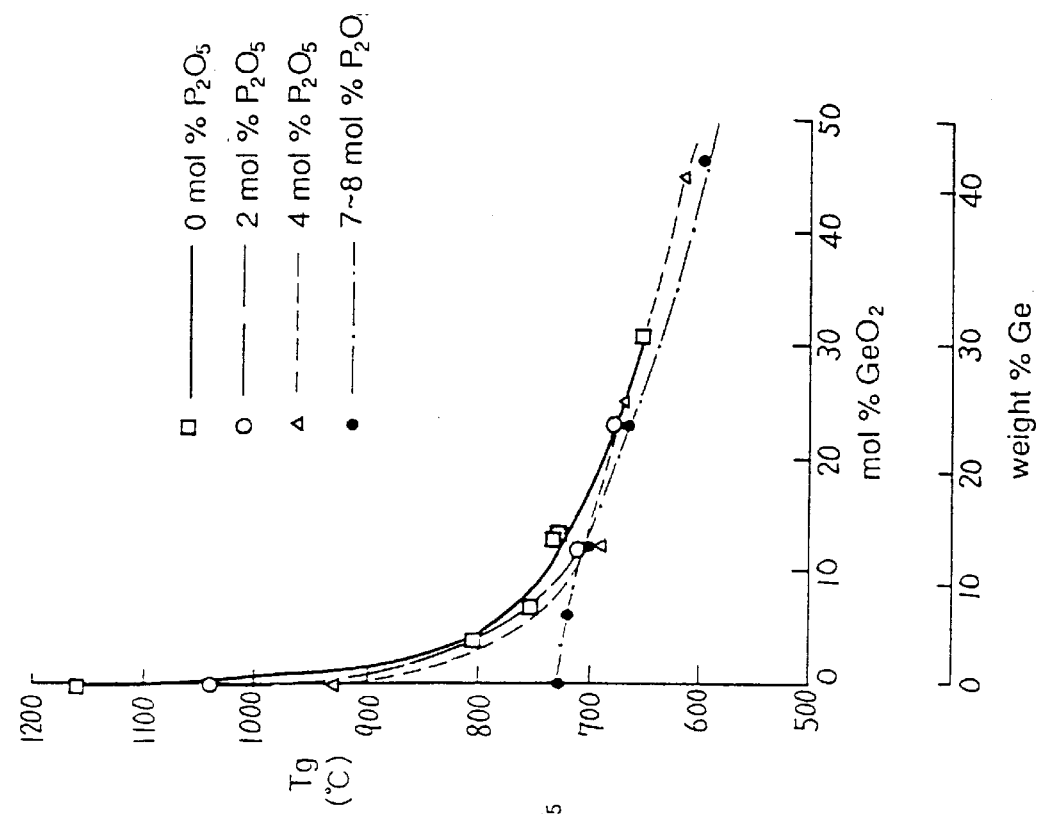
FIGS. 10(a)–(b) are a graph showing the change in glass transition temperature in accordance with a change in the impurity concentration of the insulating layer.
Figure 10A:
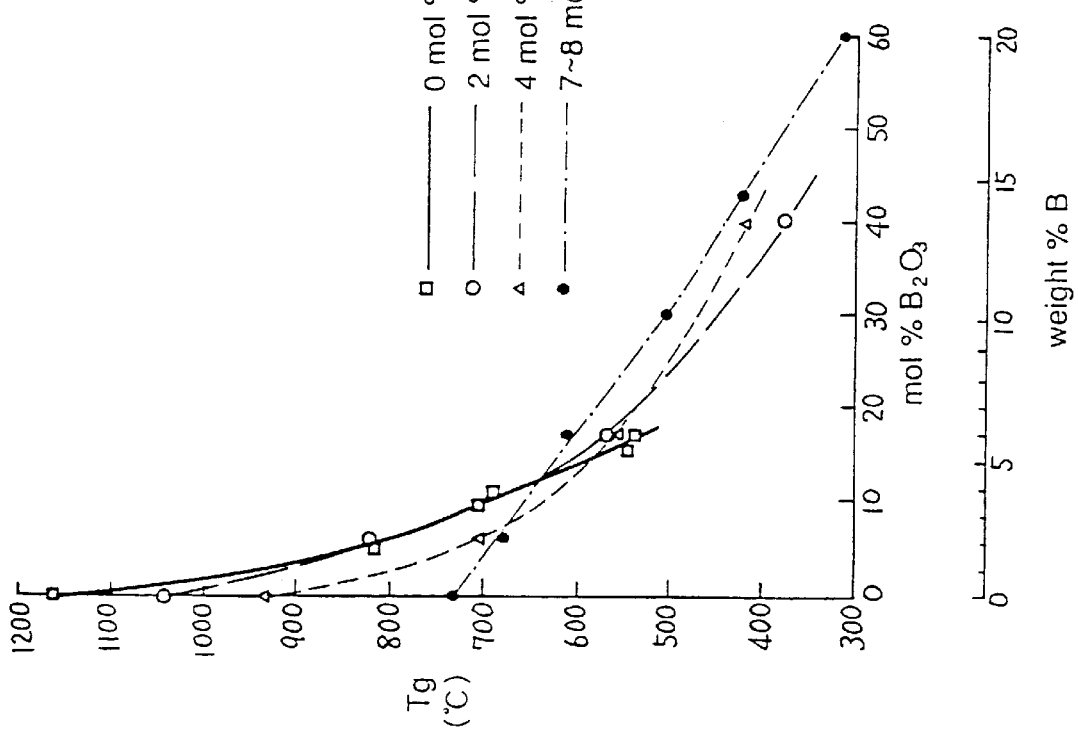

The present invention has different impurity concentrations in the first insulating layer and the second insulating in layer in order to carry out the planarization process individually of the first and second insulating layers. More specifically, the second insulating layer is set to have a low glass transition temperature (softening point) in comparison with the first insulating layer by providing different impurity concentrations between the first and second insulating layers. A change in the glass transition temperature according to the impurity concentration is described in K. Nassau et al., J. Electrochem. Soc.: SOLID-STATE SCIENCE AND TECHNOLOGY, February 1985, pages 409–415 with reference to the relationship shown in FIGS. 10(A) and (b). Referring to FIGS. 10(a) and (b), the abscissa represent the impurity concentration and the ordinate represents the Tg: glass transition temperature. The present invention can employ the impurity concentration shown in FIG. 10.

For example, 5% by mol of $B_2O_3$ is introduced as the first impurity concentration into the oxide film 3 which is the first insulating layer. 10% by mol of $B_2O_3$ is introduced as the second impurity concentration into the oxide film 5 which is the second insulating layer. In this case, the temperature of approximately 820° C. is the glass transition temperature of the oxide film 3, and a lower temperature of approximately 700° C. is the glass transition temperature of the oxide film 5, as shown in FIG. 10. The present invention is not limited to the impurity concentration shown in FIG. 10, and any impurity may be used provided that the glass transition temperature can be changed by modifying the impurity concentration and that a desirable planarization process can be carried out.

Although the present invention had the impurity concentration changed to modify the glass transition temperatures of the first and second insulating layers, the glass transition temperature thereof may be changed by the following method of (1). Furthermore, the level of planarization can be changed by the methods of (2) and (3).

(1) Change the material or the type of the impurity included in the first and second insulating layers.

(2) Change the thickness of the first and second insulating layers.

(3) Change the ambient of the thermal treatment for the planarization of the first and second insulating layers.

Figure 11:
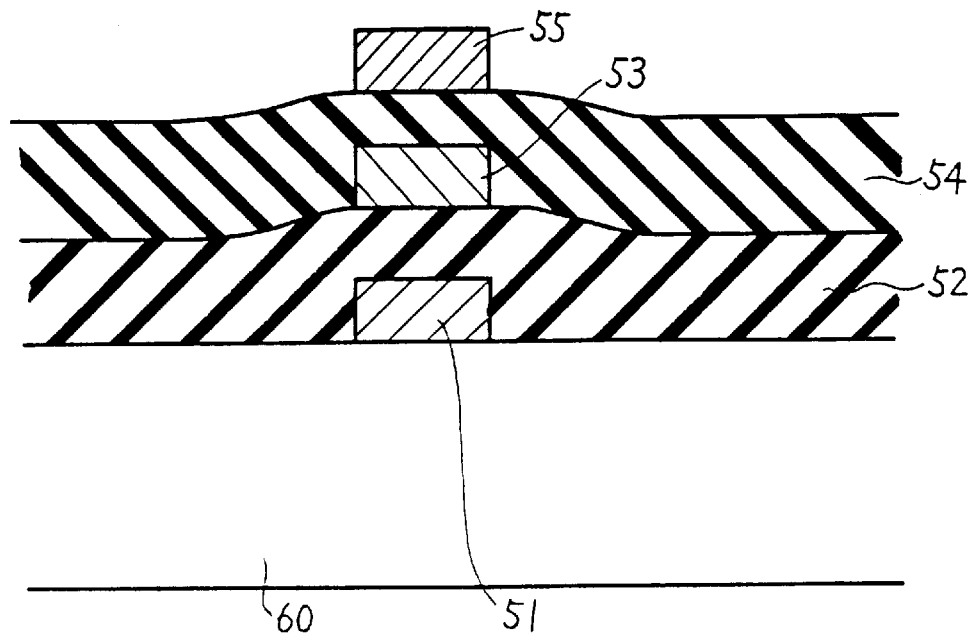
FIG. 11 is a sectional view schematically showing a structure of a semiconductor device in which the first insulating layer is formed of a material different from that of the second insulating layer.

The method of (1) is shown with reference to the structure of a semiconductor device in FIG. 11. Referring to Fig. 11, a first conductive layer 51 is formed on the surface of a semiconductor substrate 60. A first insulating layer 52 is formed to cover the first conductive layer 51. A second conductive layer 53 is formed on the surface of the first insulating layer 5Z. A second in layer 54 differing from the first insulating layer in material or the type of impurities included is formed so as to cover the second conductive layer 53. A third conductive layer 55 is formed on the surface of the second insulating layer 54.

In this structure, the first insulating layer 52 can include silicon oxide layer, and the second insulating layer 54 can include a BPSG layer. More specifically, the first insulating layer 52 is subjected to planarization by a SOG (Spin On Glass) method, followed by the second insulating layer 54 covering the second conductive layer 53 on the first insulating layer 52 being subjected to a thermal treatment for planarization.

Figure 12:
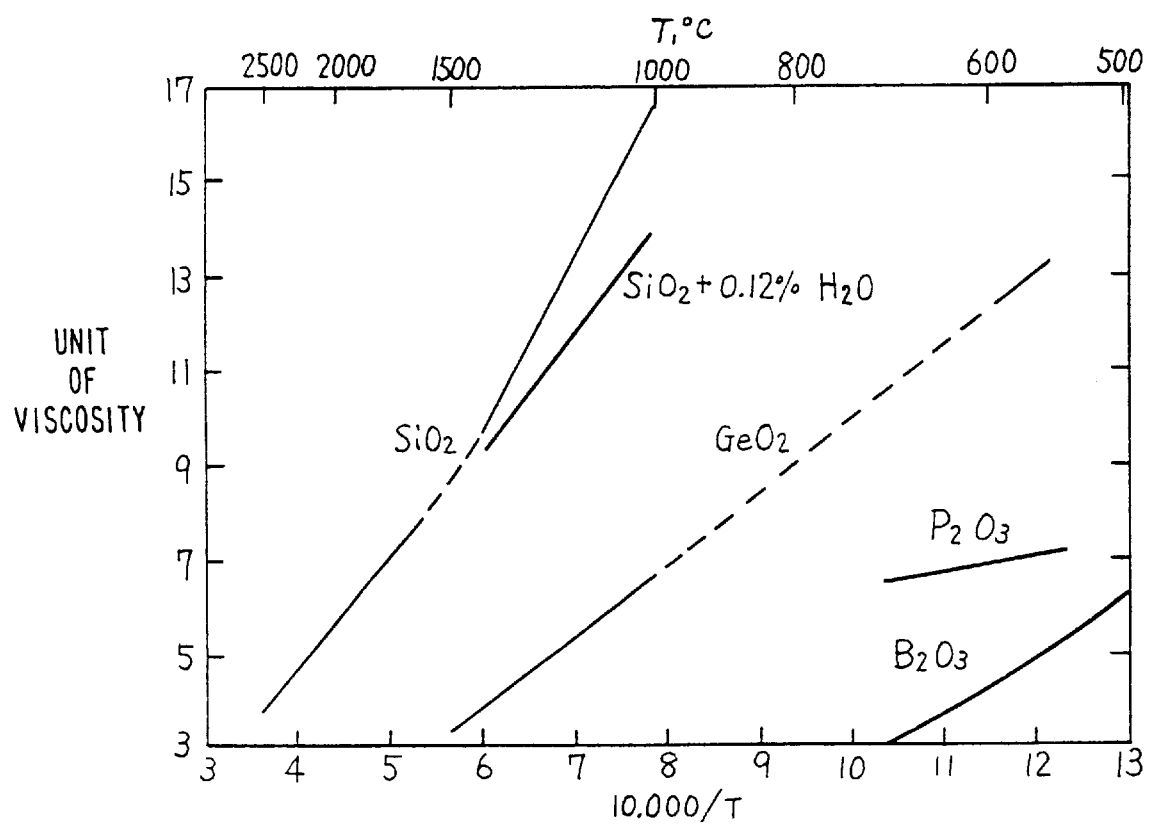
FIG. 12 is a graph showing the relationship between temperature and viscosity of various material.

A difference in viscosity depending on a material under the same temperature is disclosed in the K. Nassau et al., J. Electrochem. Soc.: SOLID-STATE SCIENCE AND TECHNOLOGY, February 1985, pp. 409–415 with reference to FIG. 12. The temperature is plotted along the abscissa and the viscosity (unit of viscosity, log viscosity poise) is plotted along the ordinate in FIG. 12. In the present invention the materials or types of impurities (such as $SiO_2$, $P_2O_3$, shown in FIG. 12 can be employed. The present invention is not limited to the type of materials or impurities shown in FIG. 12, and any material or impurity can be employed provided that the glass transition temperature can be changed by altering the type of material or impurity and that a desirable planarization process can be carried out.

Figure 13:
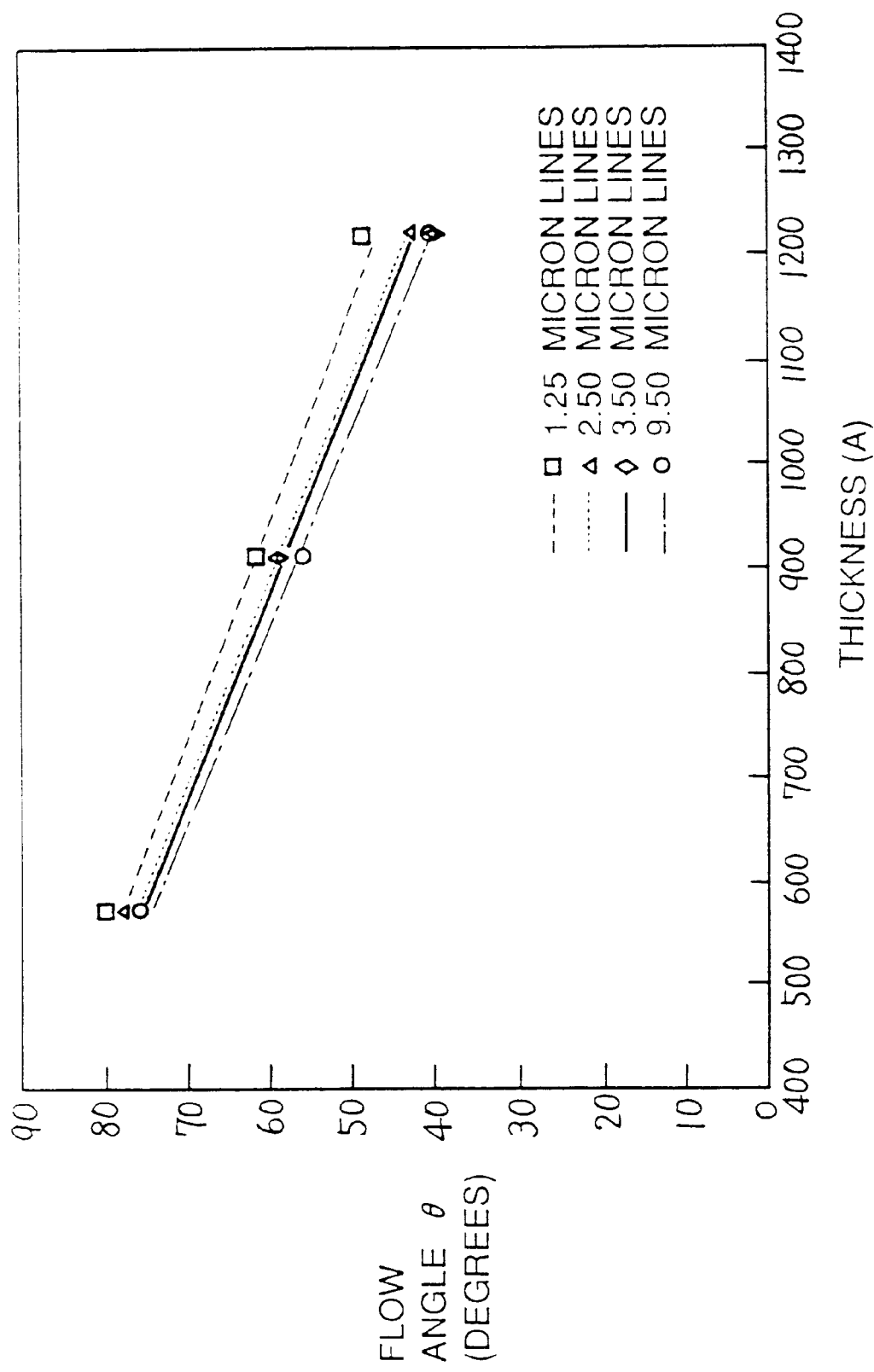
FIG. 13 is a graph showing the flow angle θ in accordance with a change in the thickness of the insulating layer including impurities.

The method of (2) in which the level of planarization is changed according to the thickness of the insulating layer is disclosed in C. Y. Fu, IEDM 85, pp. 602–605 with reference to FIG. 13. The abscissa represents the thickness and the ordinate represents the level of planarization of the insulating layer flow angle θ in FIG. 13. That is to say, according to the above-described manufacturing method of the present invention, the oxide film 3 which is the first insulating layer is formed to a first film thickness and then planarized by a thermal treatment, and the oxide film 5 which is the second insulating layer is formed to a second film thickness that is greater than the first film thickness and then subjected to a thermal treatment for planarization. It can be appreciated from FIG. 13 that the flow angle θ is smaller after thermal treatment in proportion to a greater film thickness even if the temperature of the thermal treatment is identical. This means that the oxide film 5 that is thicker than the oxide film 3 can be planarized to a degree identical to that of the oxide film 3 (flow angle θ) at a thermal treatment temperature that is lower than the thermal treatment temperature of the oxide film 3. The specimen employed is boron glass. The present invention can employ the thickness shown in FIG. 13 for the insulating layer. The present invention does not have the thickness of the insulating layer limited to that shown in FIG. 13, and any thickness can be employed provided that the level of planarization can be changed by altering the thickness of the first and second insulating layers and that a desirable planarization process can be carried out.

Figure 14A:
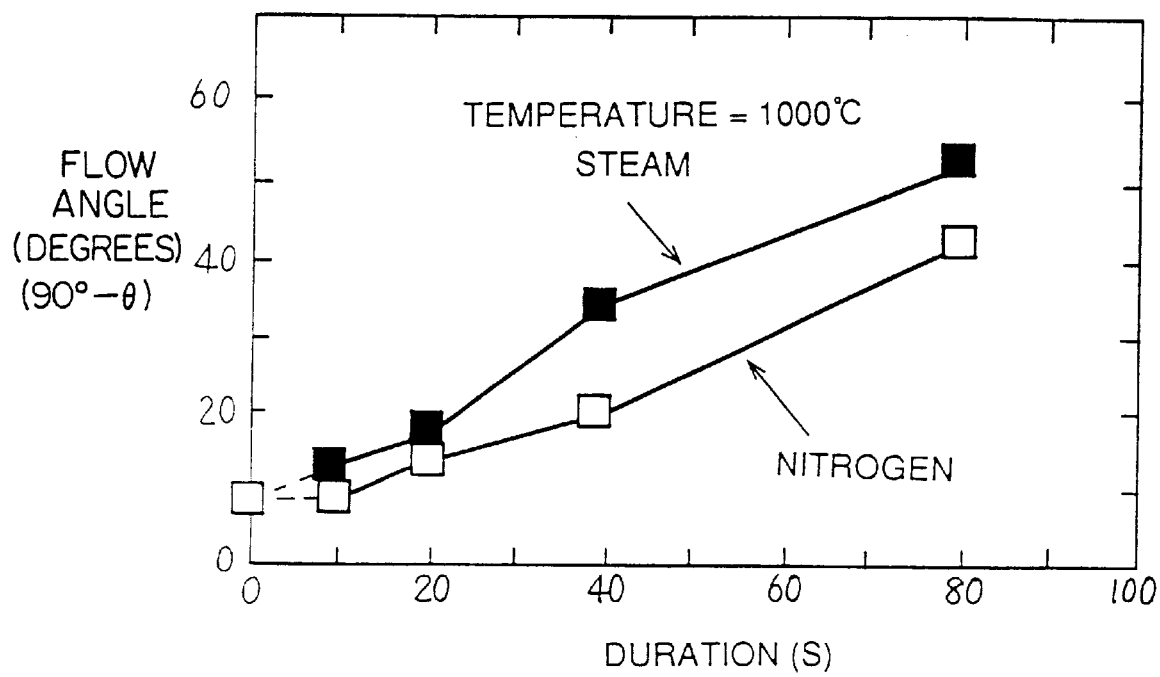
FIGS. 14(a)–(b) show the flow angle θ in accordance with a change in the ambient at the time of the planarization process.
Figure 14B:
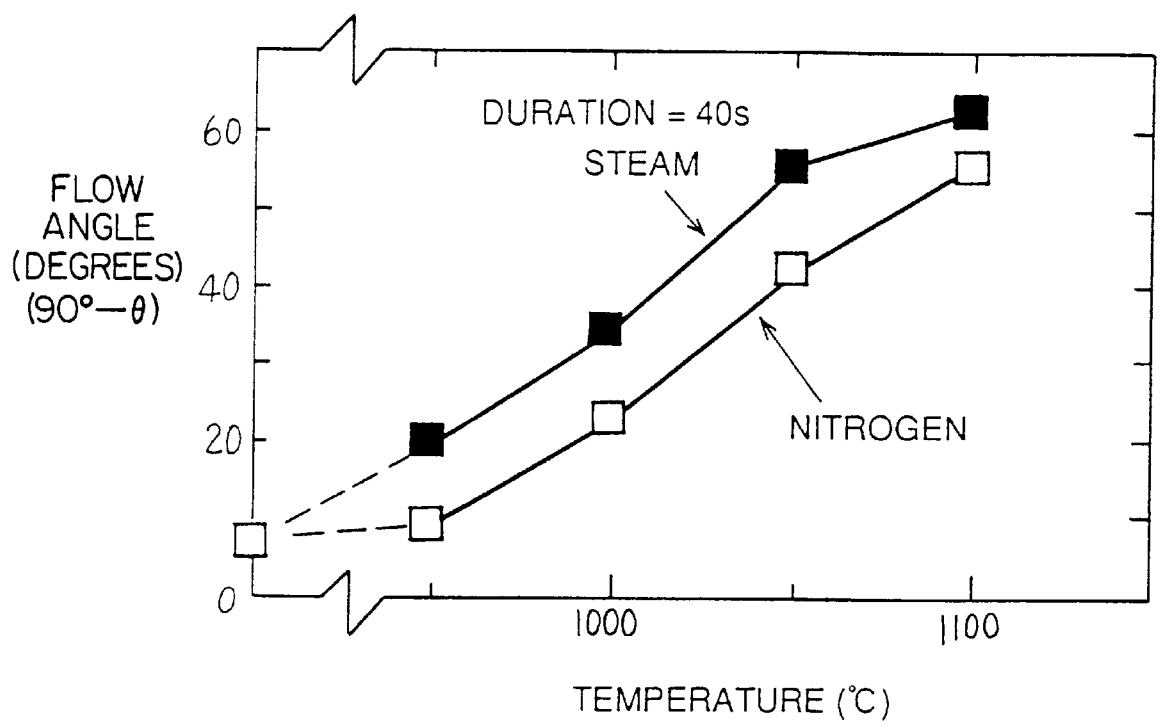
Figure 15:
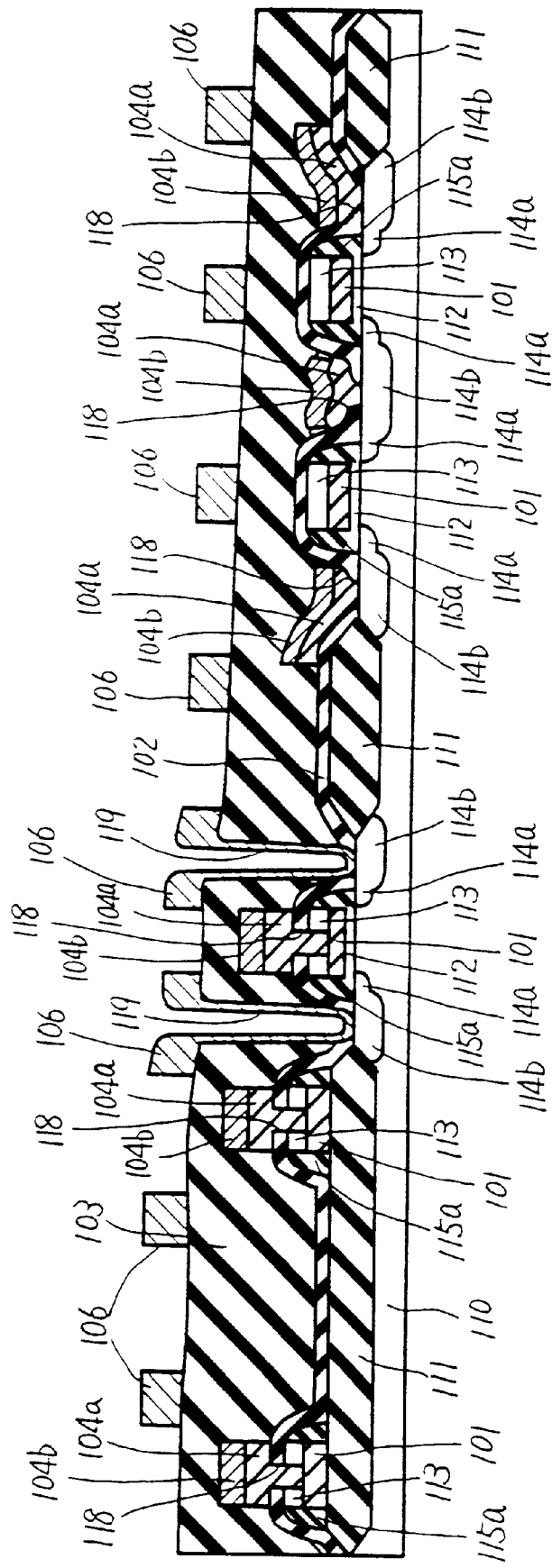
FIG. 15 is a sectional view schematically showing a structure of a conventional semiconductor device.
Figure 16:
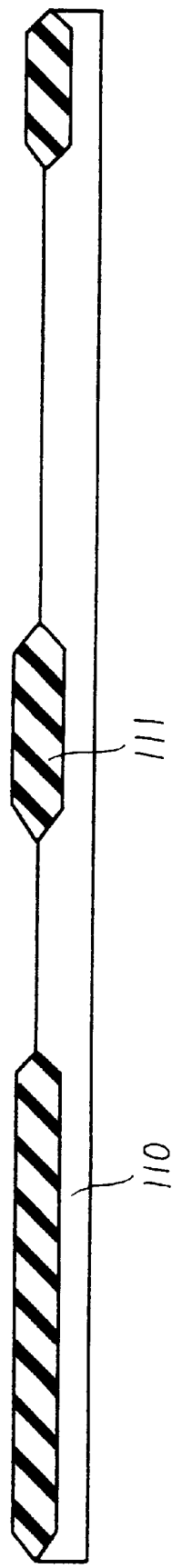
FIGS. 16–28 are sectional views of the conventional semiconductor device of FIG. 15 showing the manufacturing steps thereof.
Figure 17:
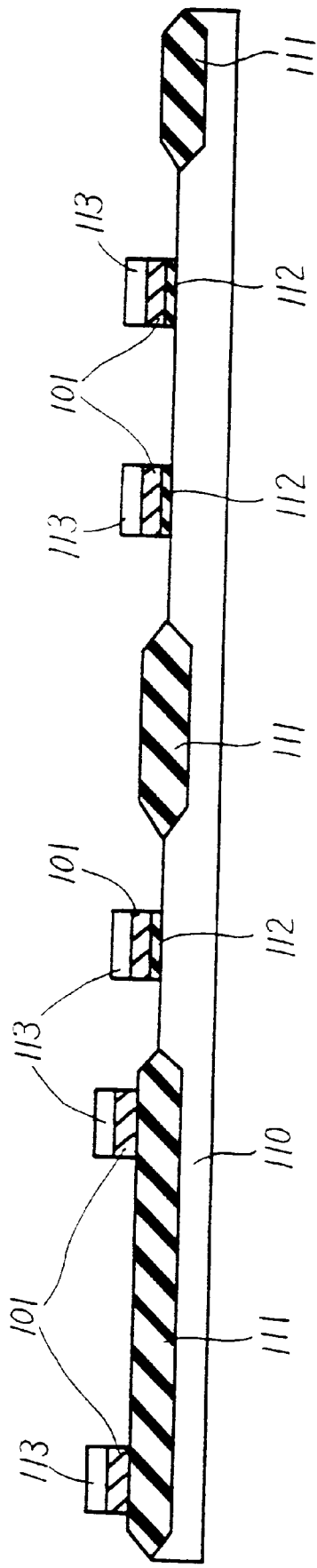
Figure 18:
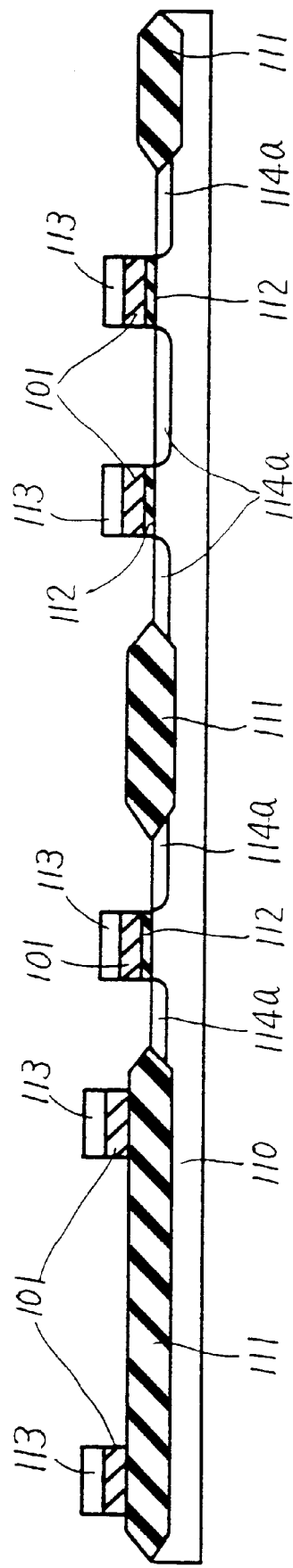
Figure 19:
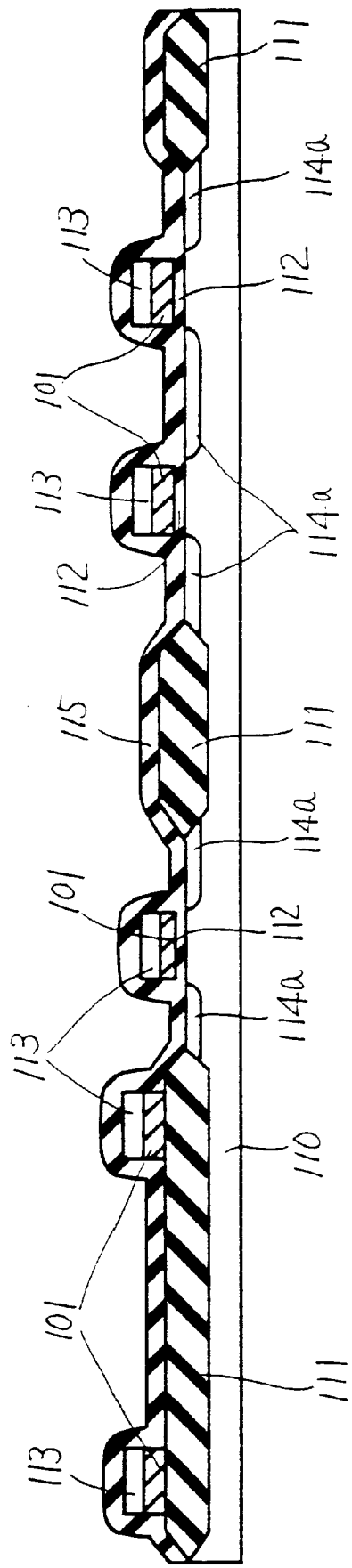
Figure 20:
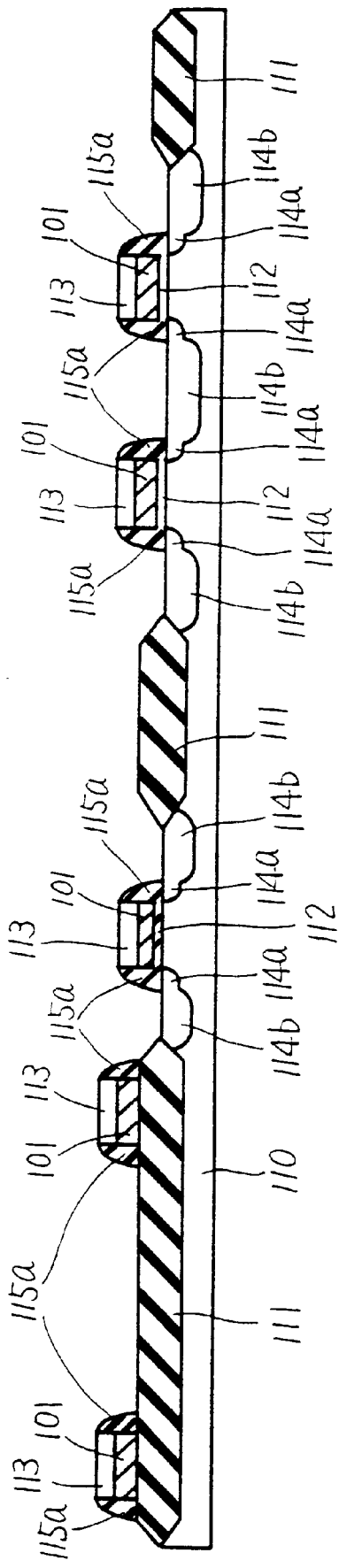
Figure 21:
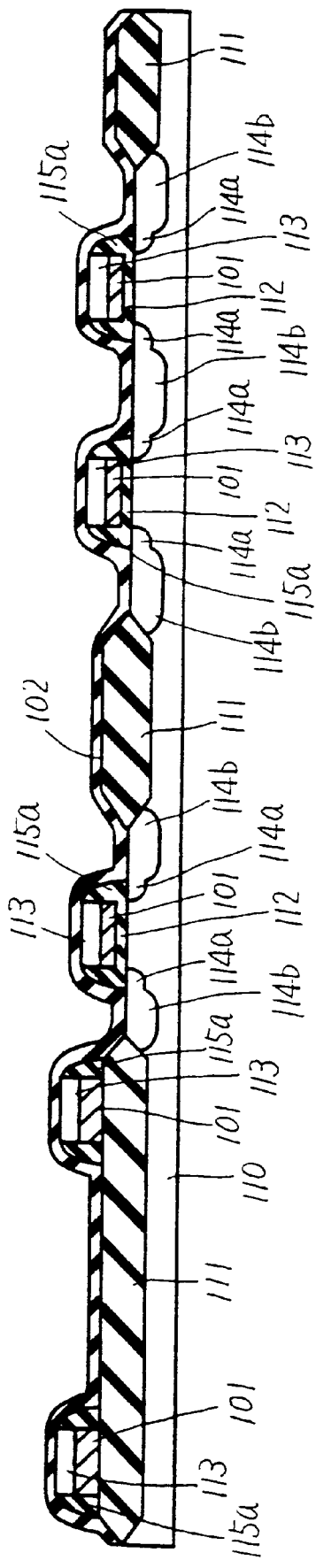
Figure 22:
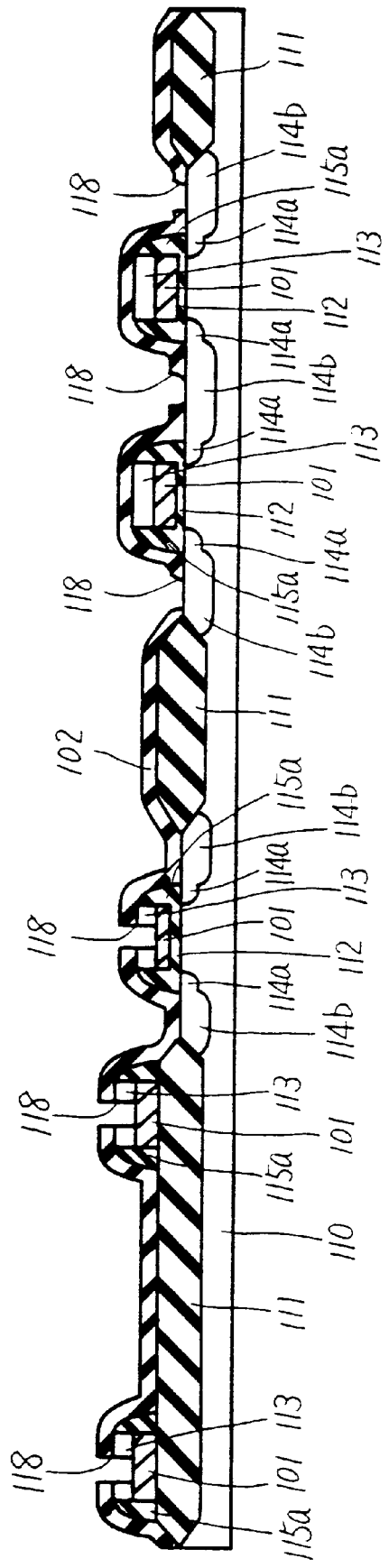
Figure 23:
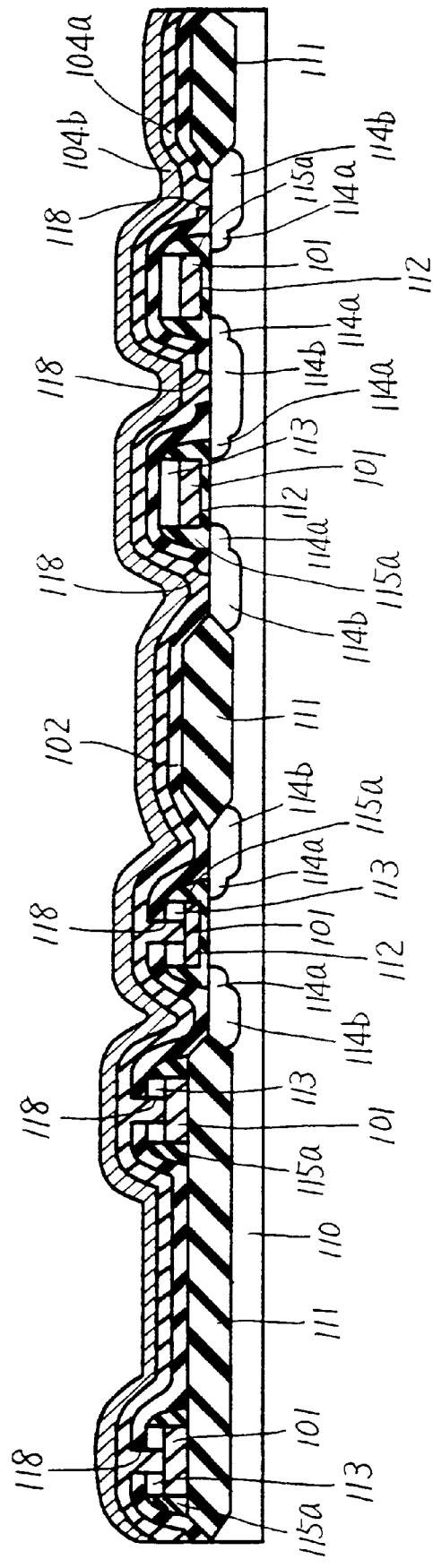
Figure 24:
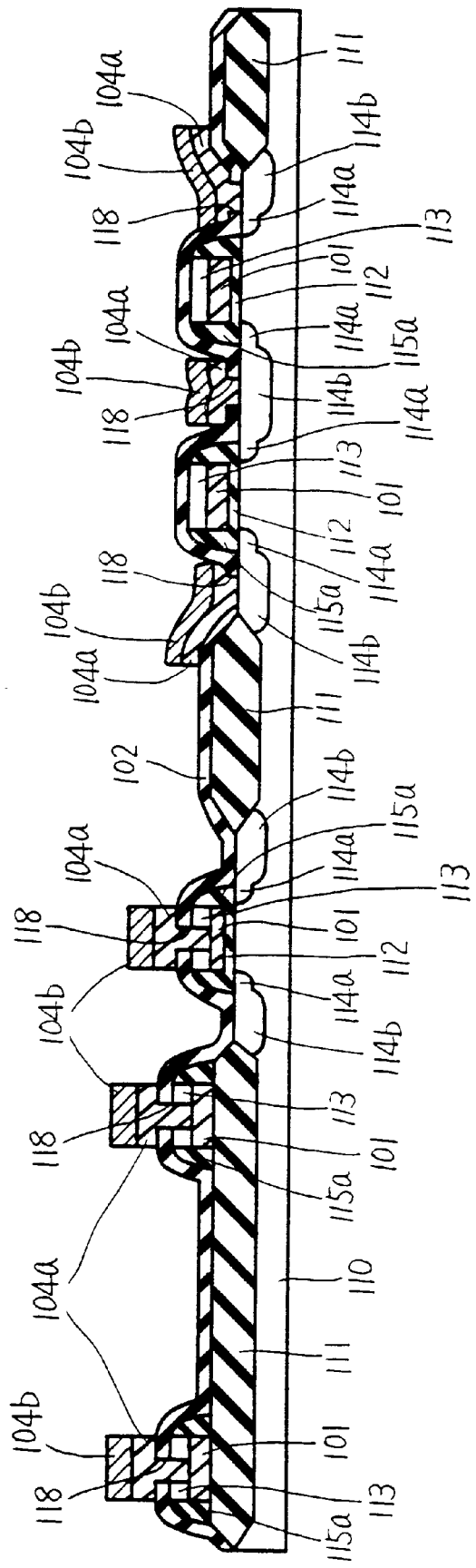
Figure 25:
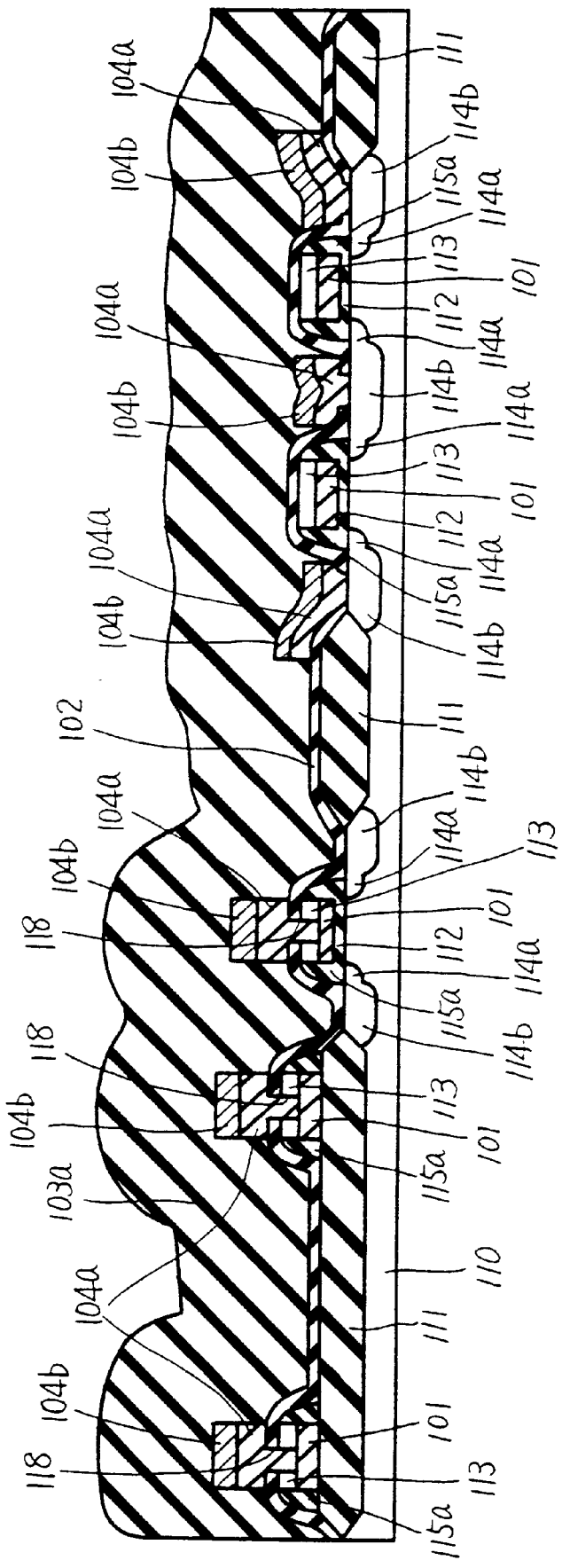
Figure 26:
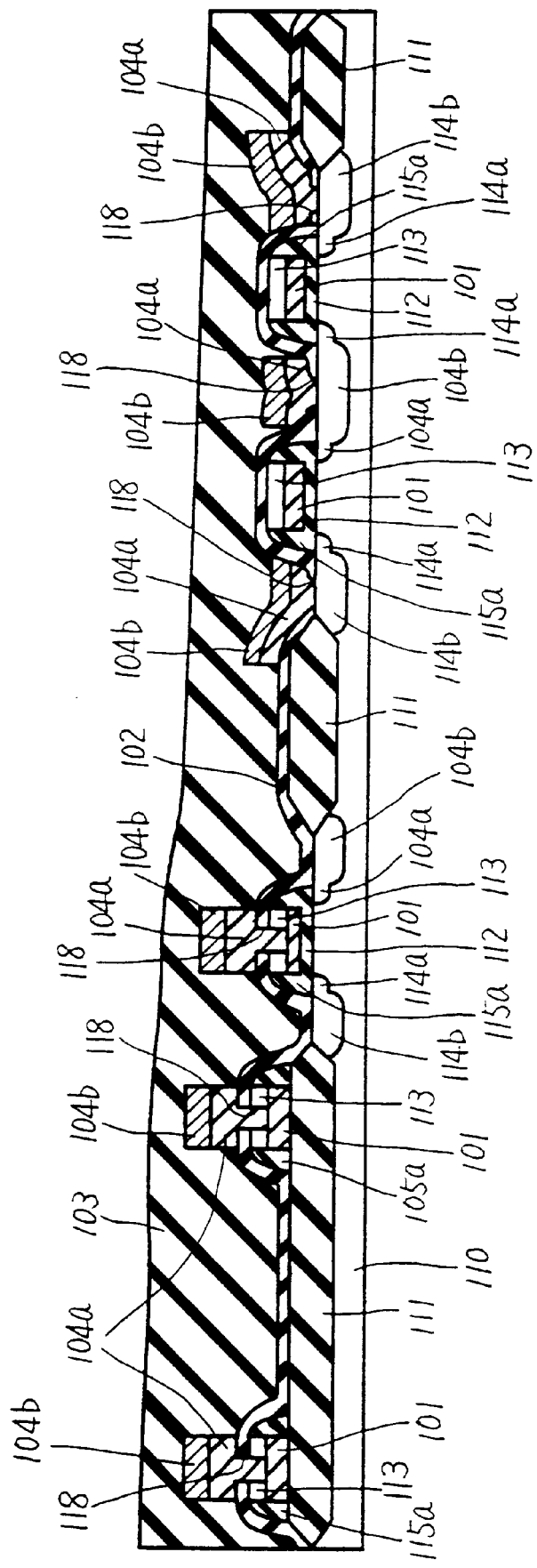
Figure 27:
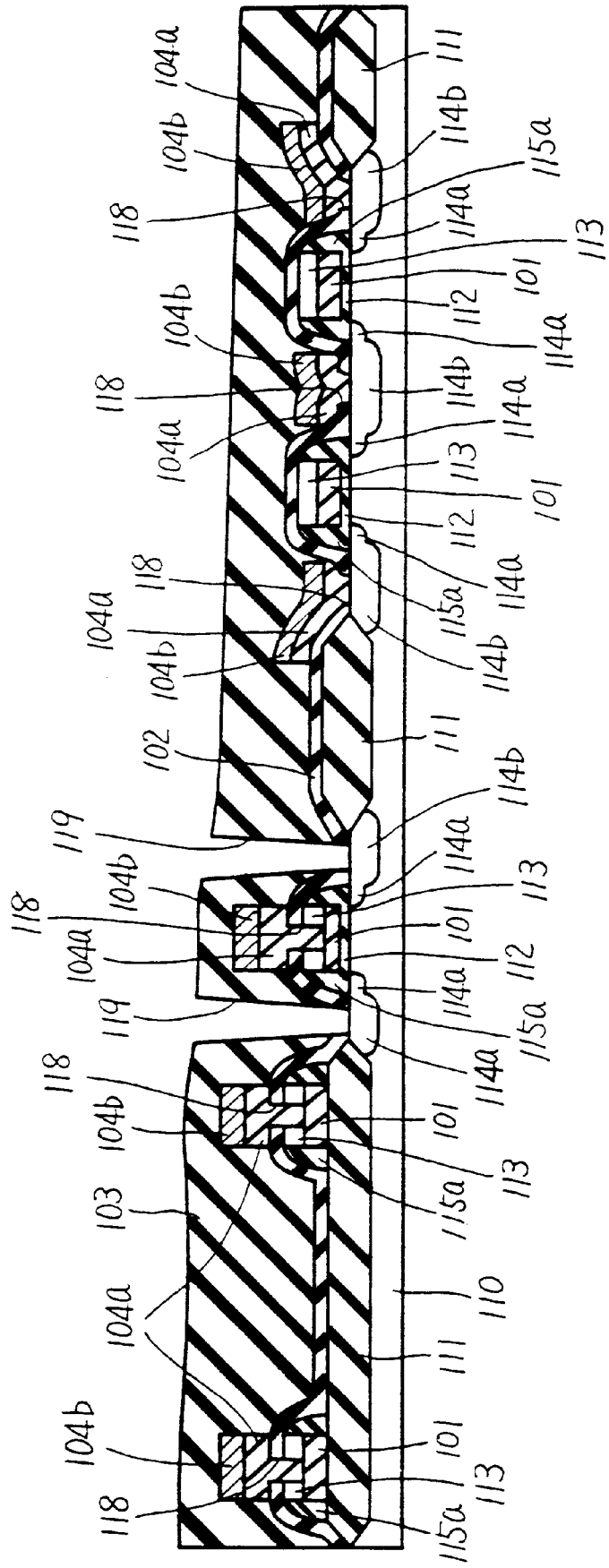
Figure 28:
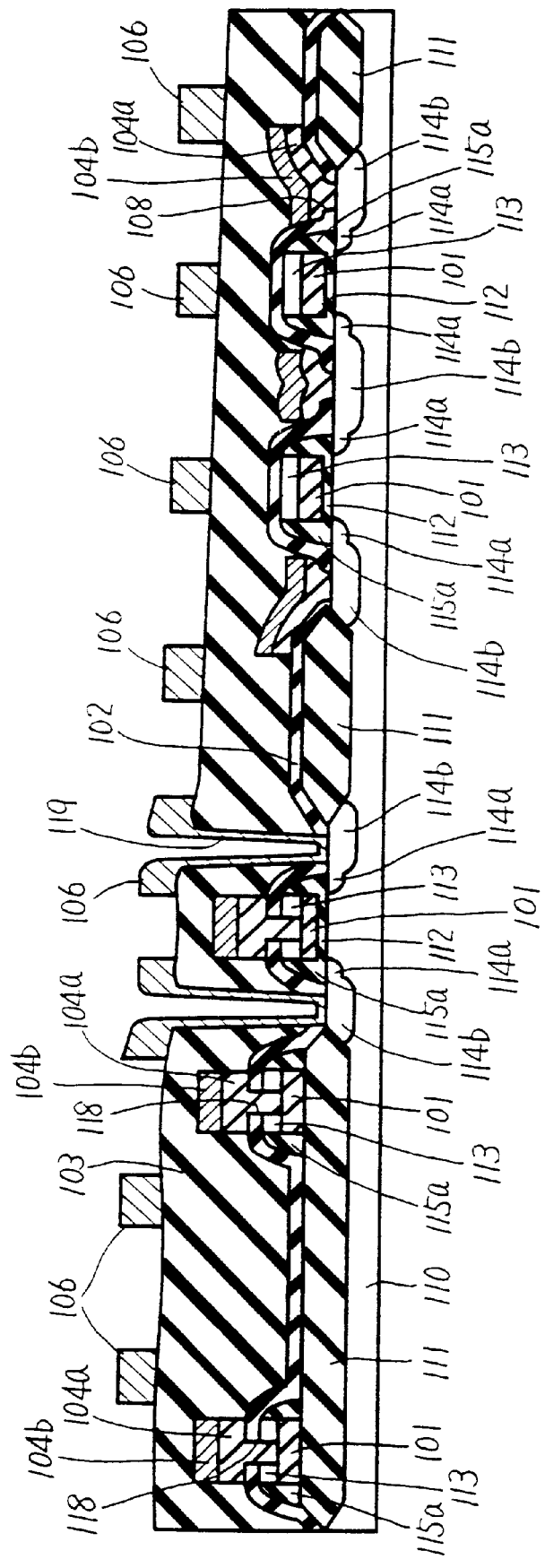
Figure 29:
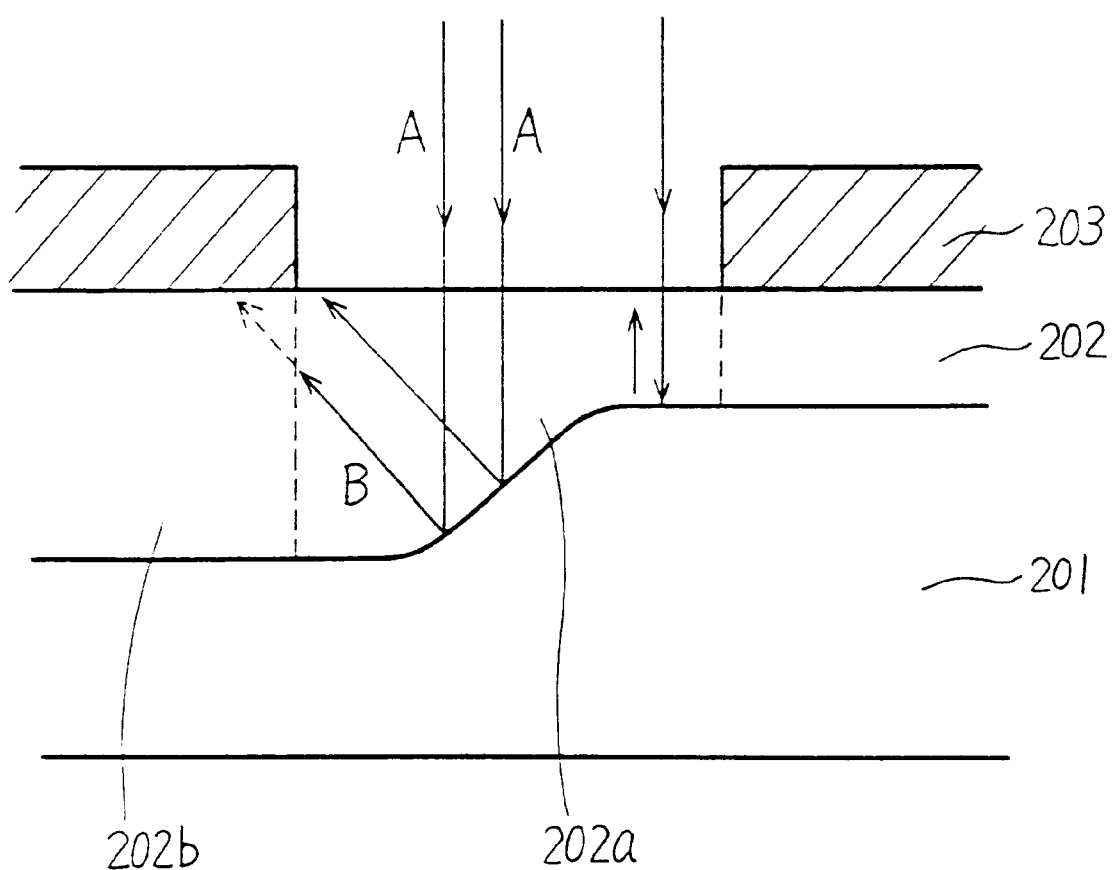
FIG. 29 schematically shows the state of exposing a resist.
Figure 30:
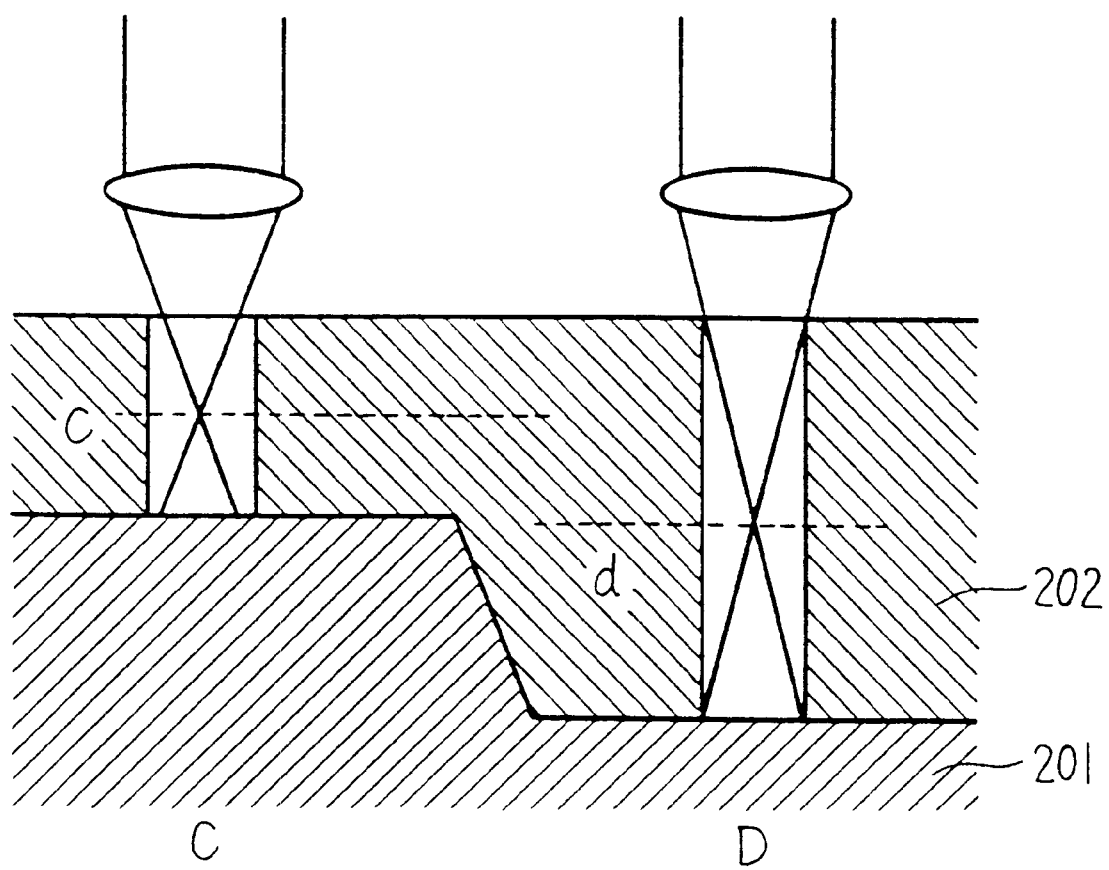
FIG. 30 is a sectional view schematically showing the optimum focusing position in exposing a resist.
Figure 31:
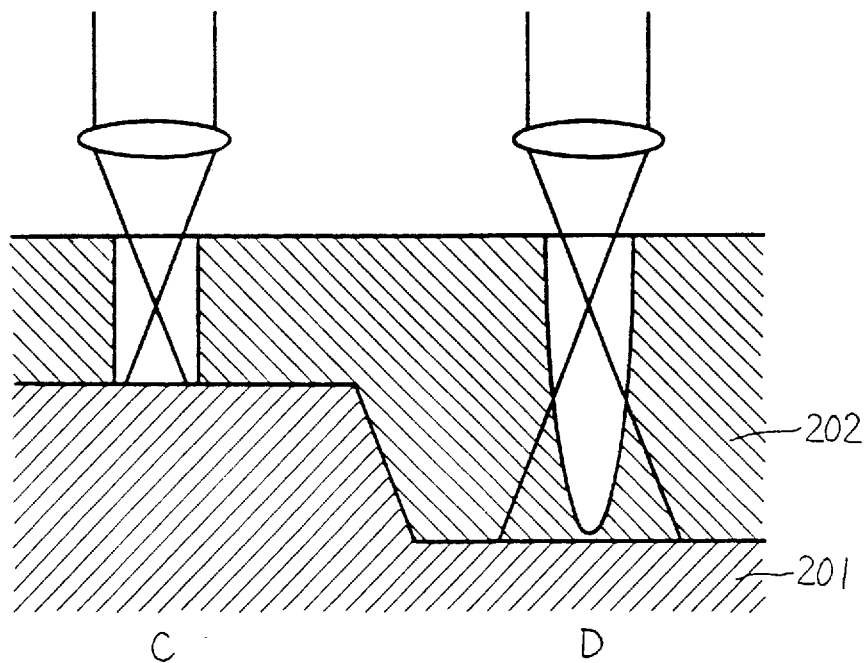
FIGS. 31 and 32 are sectional views schematically showing the state of problems encountered relevant to the focusing position in exposing the resist.
Figure 32:
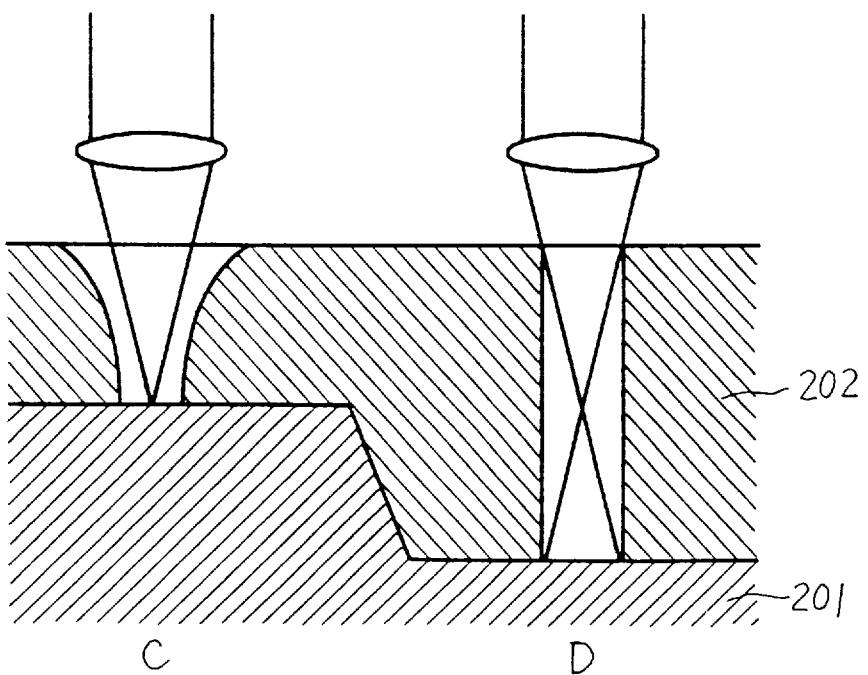
Figure 33:
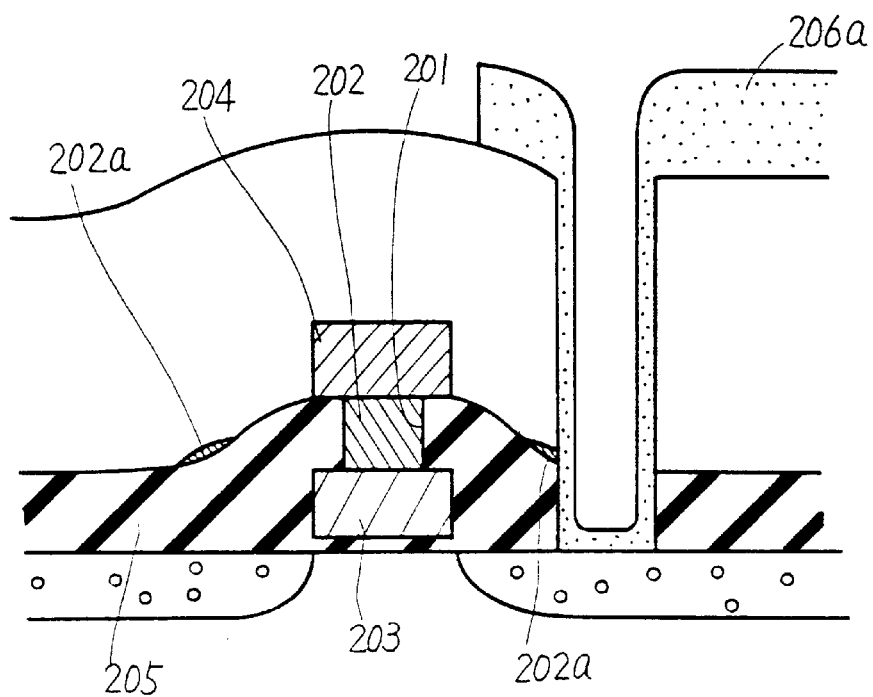
FIG. 33 is a sectional view schematically showing the state of a problem encountered by filling a connection hole wit a plug.
Figure 34:
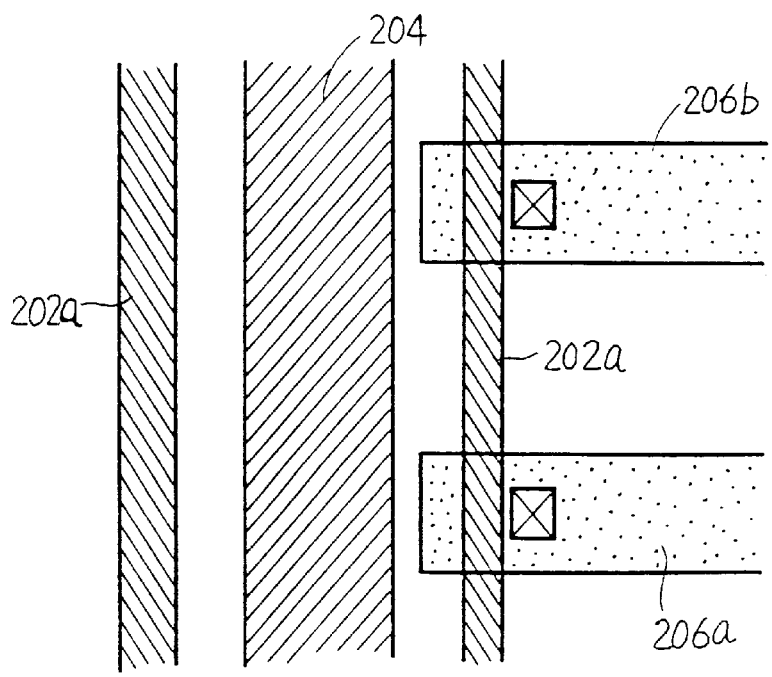
FIG. 34 is a plan view schematically showing the state of a problem encountered by filling a connection hole with a plug.

The method of (3) in which the level of planarization changes by modifying the ambient of the thermal treatment for the planarization of the insulating layer is disclosed in Jacques S. Mercier, Solid State Technology/July 1987, pp. 85–91 with reference to FIGS. 14(a) and (b). The level of planarization (flow angle θ) is plotted along the ordinates of FIGS. 14(a) and (b). The processing time duration and the temperature of planarization are plotted along the abscissa of FIGS. 14(a) and (b), respectively. The specimen is a BPSG film having boron and phosphorus added. The present invention can employ the ambients (steam ambient, nitrogen ambient) shown in FIGS. 14(a) and (b) in the thermal process for planarization. The present invention is not limited to the ambients shown in FIGS. 14(a) and (b), and any ambient can be employed provided that the level of planarization of the first and second insulating layers can be changed by modifying the ambient and that a desirable planarization process can be carried out.

The passivation film formed above the aluminum (AP) interconnection layer is generally formed of a PSG film. However, his passivation film can not be subjected to a planarization process that requires a thermal treatment of high temperature because a temperature greater than 600° C. will induce the possibility of fusion of the underlying aluminum interconnection layer.

The semiconductor device of the present invention includes a first insulating layer having a first glass transition temperature and a second insulating layer having a second glass transition temperature. Therefore, the second insulating layer has a highly planarized surface to facilitate patterning of the resist over the insulating layer to a desired configuration. Also, the problem of shorting between other conductive layers due to the existence of a residue is eliminated. Furthermore, the problem of the second conductive layer being electrically connected to another conductive layer caused by an offset in the position of the second conductive layer can be prevented. Thus, the electrical reliability is improved.

The semiconductor device according to another aspect of the present invention includes a first insulating layer formed of a first material and a second insulating layer formed of a second material. Therefore, electrical connection of the second conductive layer to another conductive layer due to an offset in position of the second conductive layer does not occur. Thus, the electrical reliability is improved.

In method of manufacturing a semiconductor device according to the present invention, the first insulating layer is made to flow at a first temperature and the second insulating layer is made to flow at a second temperature lower than the first temperature. Therefore, the second insulating layer has a highly planarized surface to facilitate the patterning of the resist over the insulating layer to a desired configuration. Also, the problem of shorting between conductive layers due to a residue is eliminated. Furthermore, because an electrical connection of the second conductive layer to another conductive layer caused by an offset in the position of the second conductive layer does not occur, the electrical reliability is improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming a first oxide film or nitride film to cover a first conductive layer, forming a first insulating layer on said first oxide film or nitride film, planarizing a surface of said first insulating layer by inducing flow of said first insulating layer at a first heating condition, forming a second oxide film or nitride film on said planarized first insulating layer, forming a third oxide film or nitride film on said second oxide film or nitride film to cover a surface of a second conductive layer on said second oxide film or nitride film, forming a second insulating layer on said third oxide film or nitride film, planarizing a surface of said second insulating layer by inducing flow of said second insulating layer at a second heating condition where said second insulating layer flows and said first insulating layer does not flow, and forming a fourth oxide film or nitride film on said planarized second insulating layer.

2. A method of manufacturing a semiconductor device, comprising the steps of:

forming a first oxide film or nitride film to cover a first patterning layer, forming a first insulating layer of a material that flows at a first predetermined temperature on said first oxide film or nitride film, heating said first insulating layer at the first predetermined temperature so as to have a planarized upper surface, forming a second oxide film or nitride film on said planarized first insulating layer, forming a third oxide film or nitride film on said second oxide film or nitride film to cover a surface of a second patterning layer on said second oxide film or nitride film, forming a second insulating layer of a material that flows at a second predetermined temperature lower than said first predetermined temperature on said third oxide film or nitride film, heating said second insulating layer at the second predetermined temperature so as to have a planarized upper surface, and forming a fourth oxide film or nitride film on said planarized insulating layer.

3. The method of manufacturing a semiconductor device according to claim 1, wherein said first and second heating conditions include ambient temperature.

4. The method of manufacturing a semiconductor device according to claim 1, wherein said first and second conditions include ambient gas.

5. The method of making a semiconductor device according to claim 2, wherein said first insulating layer and said second insulating layer have an impurity introduced, said first insulating layer having a first impurity concentration, and said second insulating layer having a second impurity concentration differing from said first impurity concentration.

6. The method of making a semiconductor device according to claim 5, wherein said second impurity concentration is higher than said first impurity concentration.

7. The method of making a semiconductor device according to claim 2, wherein said first insulating layer is formed to a first thickness, and said second insulating layer is formed to a second thickness differing from said first thickness.

8. The method of making a semiconductor device according to claim 7, wherein said second thickness is greater than said first thickness.

* * * * *